(12) United States Patent
Ooishi

(10) Patent No.: US 6,791,890 B2
(45) Date of Patent: Sep. 14, 2004

(54) SEMICONDUCTOR MEMORY DEVICE READING DATA BASED ON MEMORY CELL PASSING CURRENT DURING ACCESS

(75) Inventor: Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/160,256

(22) Filed: Jun. 4, 2002

(65) Prior Publication Data

US 2003/0103395 A1 Jun. 5, 2003

(30) Foreign Application Priority Data

Dec. 3, 2001 (JP) ........................................ 2001-369041

(51) Int. Cl.[7] ................................................ G11C 7/00
(52) U.S. Cl. ............. 365/201; 365/189.07; 365/189.09; 365/210
(58) Field of Search ............................ 365/201, 189.07, 365/189.09, 145, 207, 210, 157, 158, 171

(56) References Cited

U.S. PATENT DOCUMENTS 5,355,341 A * 10/1994 Gaultier et al. ............. 365/201

FOREIGN PATENT DOCUMENTS

JP          06-020473          1/1994

* cited by examiner

Primary Examiner—Tan T. Nguyen
(74) Attorney, Agent, or Firm—McDermott Will & Emery LLP

(57) ABSTRACT

A data read circuit produces read data in accordance with a difference between currents flowing through first and second nodes, respectively. In a data read operation, a current transmitting circuit and a reference current generating circuit pass an access current corresponding to a passing current of a selected memory cell and a predetermined reference current through first and second nodes, respectively. In a test mode, a current switching circuit passes equal test currents through the first and second nodes instead of the access current and the reference current, respectively. Thereby, offset of the current sense amplifier in the data read circuit can be evaluated.

25 Claims, 17 Drawing Sheets

SEMICONDUCTOR MEMORY DEVICE READING DATA BASED ON MEMORY CELL PASSING CURRENT DURING ACCESS

BACKGROUND OF THE INVENTION

1. Field of the Invention

The present invention relates to a semiconductor memory device, and particularly to a semiconductor memory device having memory cells, of which passing current changes depending on storage data during access.

2. Description of the Background Art

In semiconductor memory devices for executing data storage, various forms have been employed for storing data in memory cells. For example, a semiconductor memory device is configured such that a current passing through each memory cell changes depending on storage data during access. In this semiconductor memory device, storage data is read out from a selected memory cell (i.e., access target) in accordance with results of a comparison between the passing current of the selected memory cell and a preset reference current during the access. As a kind of semiconductor memory device having such memory cells, attention is being given to an MRAM (Magnetic Random Access Memory) device, which can nonvolatilely store data with low power consumption.

Particularly, in recent years, it has been announced that a performance of the MRAM device can be dramatically improved by using the thin film magnetic members, which utilize the MTJs (magnetic tunneling junctions), as memory cells. The MRAM device with memory cells having the magnetic tunneling junctions has been disclosed in technical references such as "A 10 ns Read and Write Non-Volatile Memory Array Using a Magnetic Tunnel Junction and FET Switch in Each Cell", ISSCC Digest of Technical Papers, TA7.2, February 2000, "Nonvolatile RAM based on Magnetic Tunnel Junction Elements", ISSCC Digest of Technical Papers, TA7.3, February 2000.

FIG. 16 conceptually shows a structure of a memory cell, which has a magnetic tunneling junction, and may be merely referred to as an "MTJ memory cell" hereinafter.

Referring to FIG. 16, a MTJ memory cell includes a tunneling magneto-resistance element TMR having an electric resistance, which is variable in accordance with a data level of magnetically written storage data, and an access transistor ATR. Access transistor ATR is located between a write bit line WBL and a read bit line RBL, and is connected in series to tunneling magneto-resistance element TMR. Typically, access transistor ATR is formed of a field-effect transistor arranged on a semiconductor substrate.

For the MTJ memory cell, the device includes write bit line WBL and a write digit line WDL for carrying a data write current in different directions during a data write operation, respectively, a word line WL for instructing data reading, and read bit line RBL for receiving a data read current. In the data read operation, tunneling magneto-resistance element TMR is electrically coupled between write bit line WBL carrying a ground voltage GND and read bit line RBL in response to turn-on of access transistor ATR.

FIG. 17 conceptually shows an operation of writing data in the MTJ memory cell.

Referring to FIG. 17, tunneling magneto-resistance element TMR has a ferromagnetic material layer, which has a fixed and uniform magnetization direction, and may be merely referred to as a "fixed magnetic layer" hereinafter, and a ferromagnetic material layer VL, which is magnetized in a direction depending on an externally applied magnetic field, and may be merely referred to as a "free magnetic layer" hereinafter. A tunneling barrier (tunneling film) TB formed of an insulator film is disposed between fixed magnetic layer FL and free magnetic layer VL. Free magnetic layer VL is magnetized in the same direction as fixed magnetic layer FL or in the opposite direction in accordance with the level of the storage data to be written. Fixed magnetic layer FL, tunneling barrier TB and free magnetic layer VL form a magnetic tunneling junction.

Tunneling magneto-resistance element TMR has an electric resistance, which is variable depending on a correlation in magnetization direction between fixed magnetic layer FL and free magnetic layer VL. More specifically, the electric resistance value of tunneling magneto-resistance element TMR takes a minimum value Rmin when the magnetization directions of fixed magnetic layer FL and free magnetic layer VL are same (parallel) to each other. When the magnetization directions of them are opposite (antiparallel) to each other, the above electric resistance value takes a maximum value Rmax.

In the data write operation, word line WL is inactive, and access transistor ATR is off. In this state, the data write currents for magnetizing free magnetic layer VL are supplied to bit line BL and write digit line WDL in directions depending on the level of write data, respectively.

FIG. 18 conceptually shows a relationship between the data write current and the magnetization direction of the tunneling magneto-resistance element in the data write operation.

Referring to FIG. 18, an abscissa gives a magnetic field, which is applied along an easy axis (EA) to free magnetic layer VL of tunneling magneto-resistance element TMR. An ordinate H(HA) indicates a magnetic field acting along a hard axis (HA) on free magnetic layer VL. Magnetic fields H(EA) and H(HA) correspond to two magnetic fields produced by currents flowing through bit line BL and write digit line WDL, respectively.

In the MTJ memory cell, the fixed magnetization direction of fixed magnetic layer FL is parallel to the easy axis of free magnetic layer VL, and free magnetic layer VL is magnetized in the magnetization easy direction, and particularly in the same parallel direction, which is the same direction as fixed magnetic layer FL, or in the opposite parallel direction, which is opposite to the above direction, depending on the level ("1" or "0") of the storage data. The MTJ memory cell can selectively store data ("1" and "0") of one bit corresponding to the two magnetization directions of free magnetic layer VL.

The magnetization direction of free magnetic layer VL can be rewritten only when a sum of applied magnetic fields H(EA) and H(HA) falls within a region outside an asteroid characteristic line shown in FIG. 18. Therefore, the magnetization direction of free magnetic layer VL does not change when the data write magnetic fields applied thereto have intensities corresponding to a region inside the asteroid characteristic line.

As can be seen from the asteroid characteristic line, the magnetization threshold required for changing the magnetization direction along the easy axis can be lowered by applying the magnetic field in the direction of the hard axis to free magnetic layer VL.

When the operation point in the data write operation is designed, for example, as shown in FIG. 18, the data write magnetic field in the MTJ cell selected as a data write target is designed such that the data write magnetic field in the direction of the easy axis has an intensity of $H_{WR}$. Thus, the data write current flowing through bit line BL or write digit line WDL is designed to take a value, which can provide the data write magnetic field of $H_{WR}$. In general, data write magnetic field HWR is represented by a sum of a switching magnetic field HSW required for switching the magnetization direction and a margin ΔH. Thus, it is represented by an expression of $H_{WR}=H_{SW}+\Delta H$.

For rewriting the storage data of the MTJ memory cell, i.e., the magnetization direction of tunneling magneto-resistance element TMR, it is necessary to pass the data write currents at a predetermined level or higher through write digit line WDL and bit line BL. Thereby, free magnetic layer VL in tunneling magneto-resistance element TMR is magnetized in the same parallel direction as fixed magnetic layer FL or untiparallel direction in accordance with the direction of the data write magnetic field along the easy axis (EA). The magnetization direction, which was once written into tunneling magneto-resistance element TMR, and thus the storage data of MTJ memory cell is held nonvolatilely until next data writing is executed.

FIG. 19 conceptually shows an operation of reading data from the MTJ memory cell.

Referring to FIG. 19, access transistor ATR is turned on in response to activation of word line WL in the data read operation. Write bit line WBL carries ground voltage GND. Thereby, tunneling magneto-resistance element TMR is electrically coupled to read bit line RBL while being pulled down with ground voltage GND.

In this state, read bit line RBL is pulled up with a predetermined voltage, whereby a current path including read bit line RBL and tunneling magneto-resistance element TMR carries a memory cell current Icell corresponding to storage data of the MTJ memory cell. For example, this memory cell current Icell is compared with a predetermined reference current, whereby storage data can be read out from the MTJ memory cell.

As described above, the electric resistance of tunneling magneto-resistance element TMR is variable in accordance with the magnetization direction, which is rewritable by the data write magnetic field applied thereto. Therefore, non-volatile data storage can be executed by establishing a correlation of electric resistances Rmax of Rmin of tunneling magneto-resistance element TMR with respect to levels ("1" and "0") of the storage data.

As described above, the MRAM device executes the data storage by utilizing a difference ΔR (=Rmax−Rmin) in junction resistance corresponding to a difference between storage data levels of tunneling magneto-resistance element TMR. However, this resistance difference ΔR is not sufficiently large in a general MTJ memory cell. Typically, electric resistance Rmin is equal to tens of percent of Rmax. Therefore, memory cell current Icell does not change significantly in accordance with the storage data level, but changes only on the order of microamperes ($\mu A: 10^{-6}A$).

Accordingly, it is required to make a current comparison between the passing currents of the selected memory cell with high precision. If only a current mirror sense amplifier having a general structure is used for such current comparison, the current difference cannot be detected with sufficient precision, and a malfunction may occur.

SUMMARY OF THE INVENTION

An object of the invention is to provide a semiconductor memory device, which can execute data reading based on a current comparison or a voltage comparison made with high precision.

A semiconductor memory device according to the invention includes a plurality of memory cells each having passing current changing in accordance with storage data during access; an access current transmitting circuit for passing, to a first node, an access current corresponding to the passing current of a selected memory cell selected from the plurality of memory cells as an access target; a reference current generating circuit for passing a reference current to a second node during data reading; a current comparing circuit for producing a read voltage corresponding to a difference between currents flowing through the first and second nodes, respectively; a test current supply circuit for supplying an externally test current to at least one of the first and second nodes in a test mode.

Preferably, the semiconductor memory device further includes an offset detecting circuit for evaluating offset occurring in the current comparing circuit based on the read voltage in the test mode. The test current supply circuit supplies the test currents to each of the first and second nodes in the test mode.

The semiconductor memory device thus constructed includes the test mode for evaluating the offset based on results of a comparison, which is made with the same current by the current comparing circuit extracting a current difference between the passing current of the selected memory cell and the reference current. Therefore, the offset of the current comparing circuit can be tuned with high precision. As a result, accurate data reading can be executed by detecting a minute current difference.

Preferably, the semiconductor memory device further includes a current detecting circuit for detecting a relationship in magnitude of one of the access current and the reference current with the test current based on the read voltage in the test mode. The test current supply circuit supplies the test currents to one of the first and second nodes, instead of one of the access current and the reference current, in the test mode.

In the semiconductor memory device described above, the passing current of the selected memory cell and the reference current can be determined by individually detecting the relationship in magnitude with respect to the externally test current.

According to another aspect of the invention, a semiconductor memory device includes a plurality of memory cells each for holding storage data; a first node, in a read operation, being electrically connected to a selected memory cell selected from the plurality of memory cells as an access target; a second node for transmitting a electric reference signal in order to be compared with a electric signal transmitted by the first node, in the read operation; a data read circuit for outputting a read voltage according to a difference between the electric signals of the first and second nodes in the data read operation; and an offset tuning circuit for tuning input impedance of the first and second nodes in accordance with first and second control voltages obtained by feedback of the read voltage so as to keep the read voltage within a predetermined range when the data read operation is inactive.

Preferably, The data read circuit outputs the read voltage corresponding to a voltage difference between the first and second nodes in the data read operation. The semiconductor memory device further includes a voltage holding circuit for holding the first and second control voltages; and a switch circuit for interrupting a feedback path of the read voltage in the data read operation.

In the semiconductor memory device described above, the offset tuning of the data read circuit, which performs the data reading in accordance with a voltage comparison, can be automatically executed when the data read operation is inactive. Therefore, the data read operation can be executed with the offset kept in the tuned state so that the data read operation can be performed rapidly and precisely.

Preferably, each of the plurality of memory cells has passing current changing in accordance with the storage data during access. The semiconductor memory device further includes an access current transmitting circuit for passing, to the first node, an access current corresponding to the passing current of the selected memory cell; a reference current generating circuit for passing a reference current to the second node as the electric reference signal in the data read operation; and a current switching circuit for carrying the reference current instead of the access current to the first node when the data read operation is inactive. The data write circuit outputs the read voltage according to a difference between currents flowing through the first and second nodes, respectively.

Preferably, the semiconductor memory device further includes a voltage holding circuit for holding the first and second control voltages, and a switch circuit for interrupting a feedback path of the read voltage in the data read operation.

In the semiconductor memory device described above, the offset tuning of the data read circuit, which performs the data reading in accordance with a current comparison, can be automatically executed when the data read operation is inactive. Therefore, the data read operation can be executed with the offset kept in the tuned state so that the data read operation can be performed rapidly and precisely.

According to further another aspect of the invention, a semiconductor memory device includes a plurality of memory cells having passing currents changing in accordance with storage data during access; an access current transmitting circuit for passing an access current depending on the passing current to a first node, based on a comparison between a reference voltage and a voltage on an internal node passing the passing current therethrough and connected to the selected memory cell selected as an access target from the plurality of memory cells; a reference current generating circuit for passing a reference current to a second node during data reading; a current comparing circuit for producing a read voltage corresponding to a difference between the currents flowing through the first and second nodes, respectively; and a reference current tuning circuit for tuning a level of the reference voltage in accordance with a result of manufacturing of each memory cell.

According to the semiconductor memory device described above, the level of the reference voltage used in the current transmitting circuit can be controlled in accordance with the results of manufacturing of the memory cell. Therefore, the access current according to the passing current of the selected memory cell can be detected while holding constant characteristics in the current transmitting circuit by following variations due to manufacturing of the memory cells.

According to a further aspect of the invention, a semiconductor memory device includes a plurality of memory cells, an access current transmitting circuit, a reference current generating circuit and a current comparing circuit. In the plurality of memory cells, passing currents change in accordance with storage data during access. The access current transmitting circuit passes through a first node an access current corresponding to the passing current of the selected memory cell selected as an access target from the plurality of memory cells. The reference current generating circuit passes a reference current through a second node during data reading. The reference current generating circuit includes a plurality of dummy memory cells formed on the semiconductor memory device, and each having a structure similar to that of the memory cell, and a current generating circuit for generating the reference current based on the passing currents of the plurality of dummy memory cells. At least one of the plurality of dummy memory cells store one of two kinds of levels of the storage data, and at least another the memory cells store the other of the two kinds of levels of the storage data. The current comparing circuit produces a read voltage corresponding to a difference between currents flowing through the first and second nodes, respectively.

According to the semiconductor memory device described above, the level of the reference voltage used in the current transmitting circuit can be tuned in accordance with an actual electric resistance of the memory cell. Accordingly, the characteristics of the current transmitting circuit can be kept constant while following variations due to manufacturing of the memory cells.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings.

First Embodiment

Figure 1:
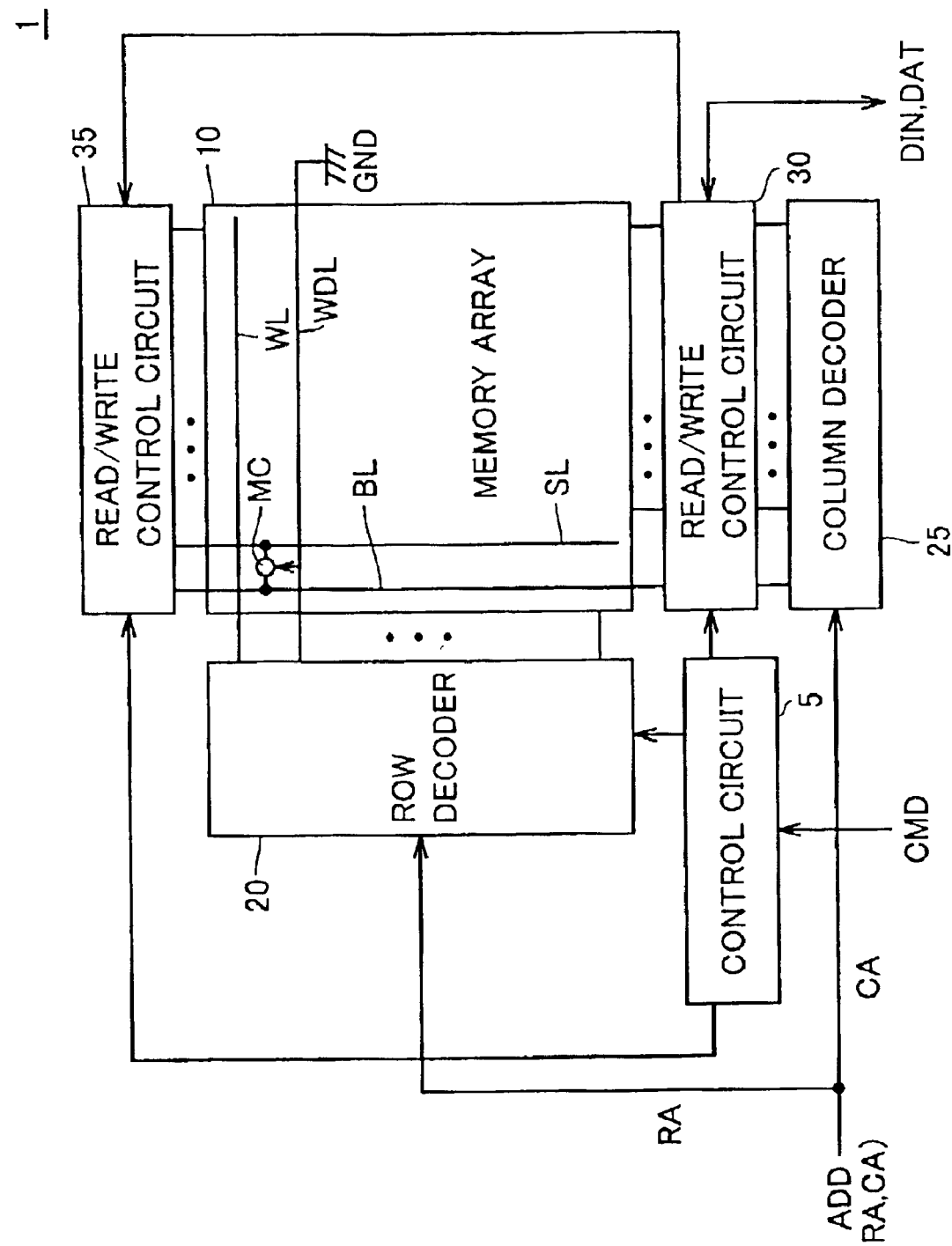
FIG. 1 is a schematic block diagram showing a whole structure of an MRAM device according to an embodiment of the invention.

Referring to FIG. 1, an MRAM device 1 according to a first embodiment of the invention executes random access in response to a control signal CMD and an address signal ADD, which are externally applied, and executes input of write data DIN and output of read data DOUT.

MRAM device 1 includes a control circuit 5 for controlling a whole operation of MRAM device 1 in response to control signal CMD, and a memory array 10 having a plurality of MTJ memory cells arranged in rows and columns.

In memory array 10, a word line WL and a write digit line WDL are arranged corresponding to each row of the MTJ memory cells, and a bit line BL and a source line SL are arranged corresponding to each column of the MTJ memory cells. FIG. 1 typically shows one MTJ memory cell MC as well as an arrangement of word line WL, write digit line WDL, bit line BL and source line SL provided for MTJ memory cell.

MRAM device 1 further includes a row decoder 20, which decodes a row address RA represented by an address signal to execute row selection in memory array 10, a column decoder 25, which decode a column address CA represented by address signal ADD to execute column selection in memory array 10, and read/write control circuits 30 and 35.

Each of read/write control circuits 30 and 35 is formed of a collection of circuits such as a circuit for passing a data write current through bit line BL in the data write operation, a circuit for passing a data read current through bit line BL in a data read operation and a circuit for producing read DAT in the data read operation.

Write digit line WDL is coupled to a fixed voltage (e.g., ground voltage GND) at a region spaced from row decoder 20 with memory array 10 therebetween. Row decoder 20 couples write digit line WDL, which is selected in accordance with results of row selection, to power supply voltage Vcc for activating it in the data write operation. Thereby, activated write digit line WDL is connected at its opposite ends to power supply voltage Vcc and ground voltage GND, respectively. Therefore, a data write current Ip can flow in the row direction through activated write digit line WDL. Data write current Ip in the row direction is constant independently of the level of write data.

Row decoder 20 fixes unselected write digit lines WDL to ground voltage GND. Thereby, data write current Ip does not flow in the row direction through unselected write digit lines WDL.

Figure 2:
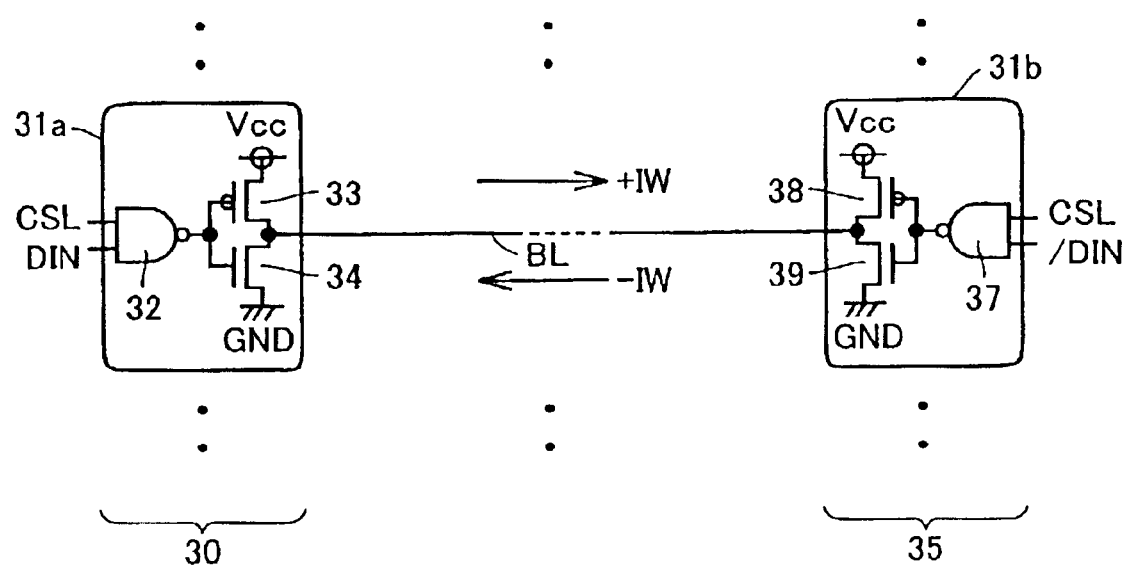
FIG. 2 is a circuit diagram showing a structure of a write driver for passing a data write current through a bit line in a selected column.

Referring to FIG. 2, read/write control circuit 30 has a write driver 31a provided corresponding to one end of bit line BL. Read/write control circuit 35 has a write driver 31b provided corresponding to the other end of bit line BL. Although FIG. 2 shows an arrangement of write drivers 31a and 31b corresponding to one bit line BL, which is shown as a typical example, similar write drivers are arranged corresponding to each of the bit lines in the respective memory cell columns.

Write driver 31a includes an NAND gate 32, which have two inputs receiving a column select signal CSL representing results of column selection in the corresponding memory cell column and write data DIN, respectively, a P-channel MOS transistor 33 connected between one end of corresponding bit line BL and power supply voltage Vcc, and an N-channel MOS transistor 34 which is electrically coupled between one end of corresponding bit line BL and ground voltage GND.

Each of transistors 33 and 34 receives on its gate an output of NAND gate 32. Thus, transistors 33 and 34 operate as an inverter driving one end of bit line BL in accordance with a level of write data DIN in the selected column.

Write driver 31b includes an NAND gate 37 having two inputs, which receive column select signal CSL representing results of column selection in the corresponding memory cell column and an inverted signal /DIN of write data, respectively, a P-channel MOS transistor 38 connected between the other end of corresponding bit line BL and power supply voltage Vcc, and an N-channel MOS transistor 39 electrically coupled between the other end of corresponding bit line BL and ground voltage GND.

Each of transistors 38 and 39 receives on its gate an output of NAND gate 37. Thus, transistors 38 and 39 operate as an inverter, which drives the other end of bit line BL in accordance with inverted level (/DIN) of write data DIN in the selected column. The drive voltages of write drivers 31a and 31b may be voltages other than ground voltage GND and power supply voltage Vcc. In the following description, binary voltage state, i.e., a high voltage state (e.g., power supply voltage Vcc) and a low voltage state (e.g., ground voltage GND) of signals, signal lines, data and others may also be referred to as "H-level" and "L-level", respectively.

In the unselected column, each of outputs of NAND gates 32 and 37 is set to H-level. Therefore, opposite ends of bit line BL in each unselected column are coupled to ground voltage GND. In the selected column, however, the outputs of NAND gates 32 and 37 are set to one and the other of H- and L-levels in accordance with the level of write data DIN, respectively. Therefore, opposite ends of bit line BL in the selected column are set to one and the other of power supply voltage Vcc and ground voltage GND in accordance with the level of write data DIN, respectively.

As a result, bit line BL in the selected column carries either a data write current +Iw in a direction from write driver 31a to write driver 31b or a data write current −Iw in a direction from write driver 31b to write driver 31a in accordance with the level of write data DIN. Thus, data write currents ±Iw flowing through bit line BL in the selected column are set in accordance with the level of write data DIN.

In tunneling magneto-resistance element TMR corresponding to write digit line WDL and bit line BL, both of which carry the data write currents, write data corresponding to the direction of data write current ±Iw is magnetically written.

An operation of reading data from memory array 10 will now be described.

Figure 3:
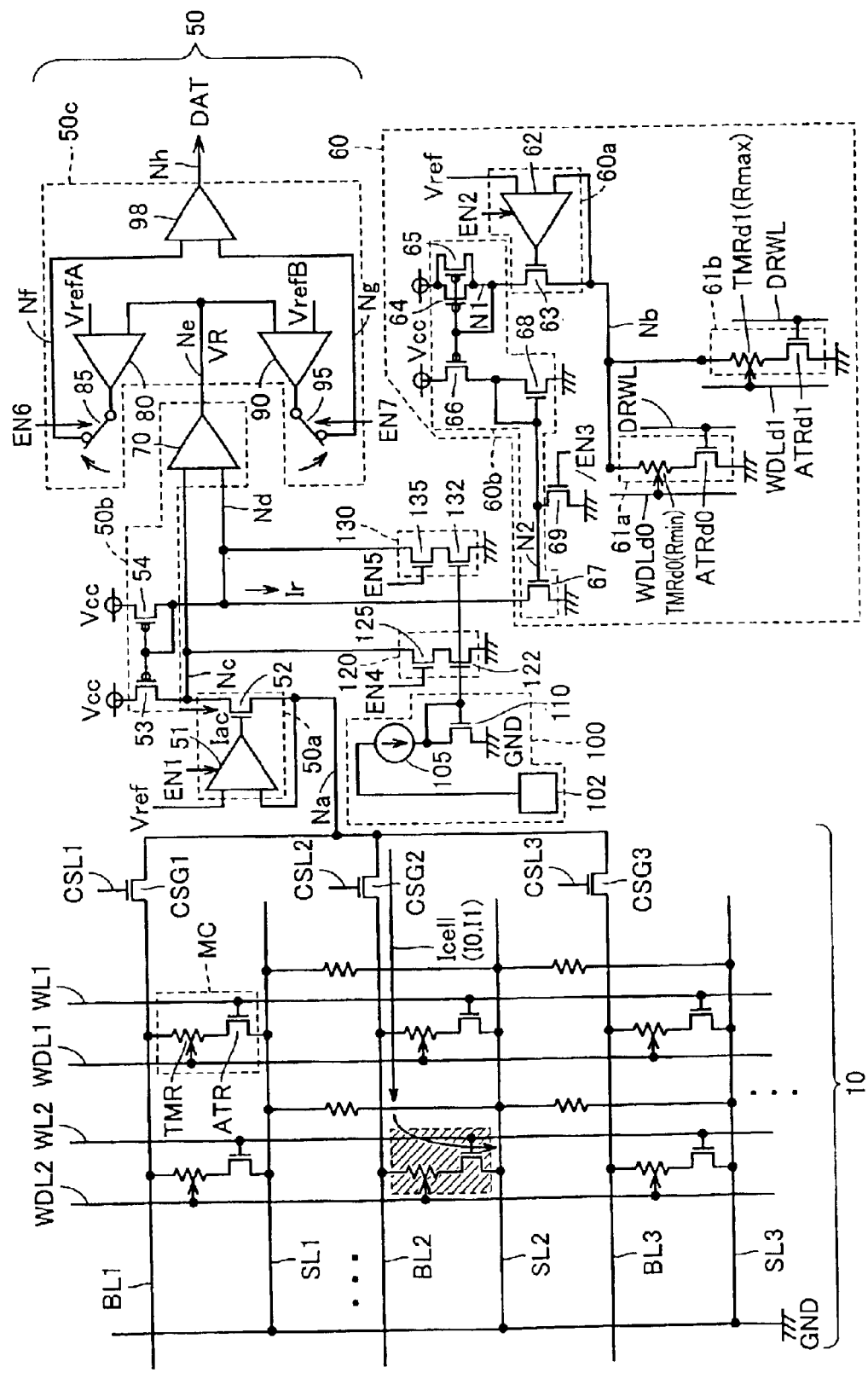
FIG. 3 is a circuit diagram showing a structure of a data read circuit system according to the first embodiment.

Referring to FIG. 3, memory array 10 includes MTJ memory cells MC arranged in rows and columns. FIG. 3 representatively shows only some of MTJ memory cells MC as well as word lines WL1 and WL2, write digit lines WDL1 and WDL2, bit lines BL1–BL3 and source lines SL1–SL3 corresponding to MTJ memory cells MC shown in FIG. 3.

Figure 16:
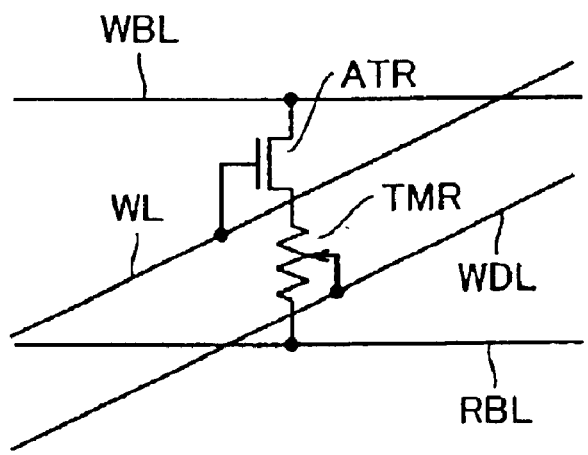
FIG. 16 conceptually shows a structure of an MTJ memory cell.
Figure 17:
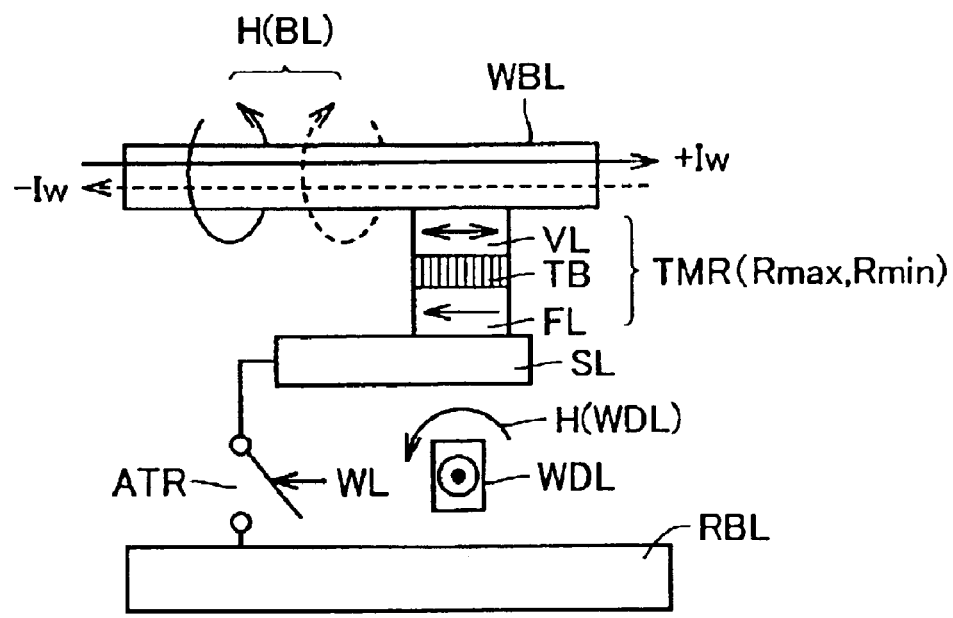
FIG. 17 conceptually shows an operation of writing data into the MTJ memory cell.
Figure 18:
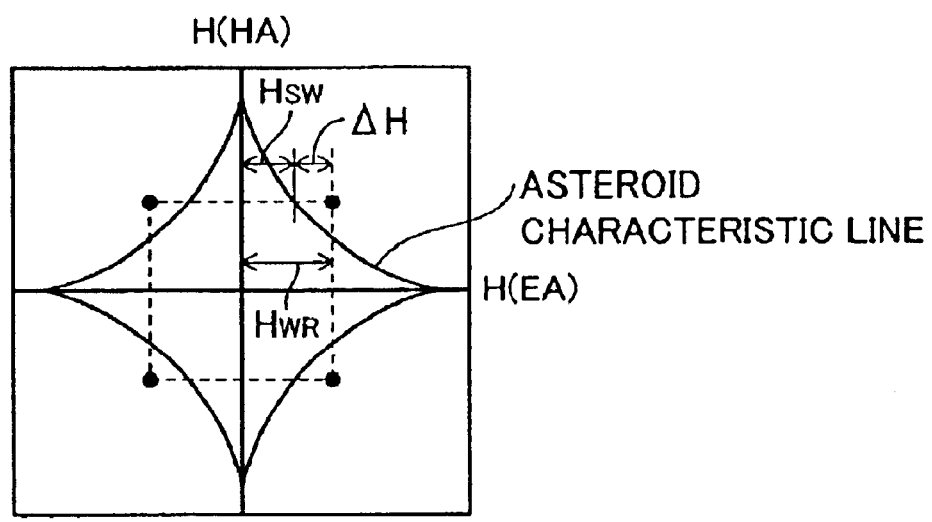
FIG. 18 conceptually shows a relationship between a data write current and a magnetization direction of a tunneling magneto-resistance element during data writing.
Figure 19:
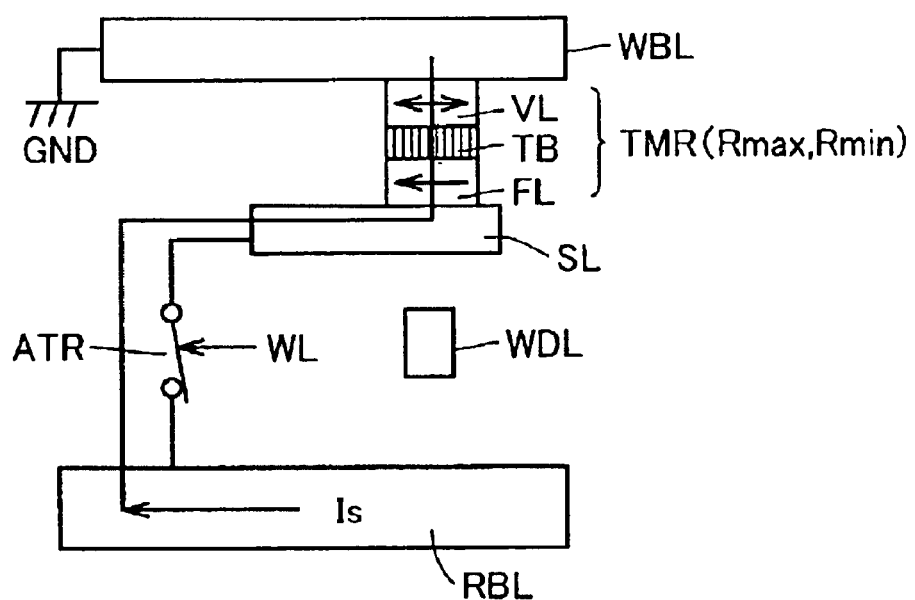
FIG. 19 conceptually shows reading of data from the MTJ memory cell.

MTJ memory cell MC has the same structure as that already described with reference to FIG. 16, and includes tunneling magneto-resistance element TMR and access transistor ATR, which are connected in series between corresponding bit line BL and source line SL. Tunneling magneto-resistance element TMR are magnetized in the direction corresponding to the storage data, and stores data at either H-level ("1") or L-level ("0"). Tunneling magneto-resistance element TMR has an electrical resistance set to either Rmax or Rmin depending on the data stored therein.

Each source line SL is coupled to ground voltage GND. Further, neighboring source lines SL are electrically coupled via a resistance component. This structure can suppress floating of the voltage on each source line SL so that the source voltage of access transistor ATR can be reliably equal to ground voltage GND.

For each memory cell column, a column select gate CSG and column select line CSL are arranged. FIG. 3 representatively shows column select lines CSL1–CSL3 and column select gates CSG1–CSG3, which correspond to bit lines BL1–BL3, respectively. Each column select line CSL is activated to attain H-level when corresponding memory cell column is selected in accordance with column address CA. Each column select gate CSG is turned on, and electrically couples corresponding bit line BL and node Na when corresponding column select line is activated to attain H-level.

For example, when the MTJ memory cell, which is hatched in FIG. 3 and belongs to the second row and the second column, is selected as an access target, corresponding word line WL2 and column select line CSL2 are activated to attain H-level. (The MTJ memory cell selected as the access target is merely referred to as a "selected memory cell", hereinafter). In response to this activation, column select gate CSG2 and access transistor ATR in the selected memory cell are turned on so that a memory cell current Icell flows through a path extending from node Na through bit line BL2, column select gate CSG2, bit line BL2, tunneling magneto-resistance element TMR and access transistor ATR to source line SL2 (ground voltage GND). Memory cell current Icell, i.e., the passing current, which flows through the selected memory cell during the access, changes depending on an electric resistance (Rmax or Rmin) of corresponding tunneling magneto-resistance element TMR, i.e., the storage data of the selected memory cell (I1 or I0).

As a part of read/write control circuit 30 shown in FIG. 1, a data read circuit 50 and a reference current generating circuit 60 are employed.

Data read circuit 50 has a current transmitting circuit 50a for transmitting memory cell current Icell to be passed through the selected memory cell to a node Nc, a current sense amplifier 50b for amplifying a difference between currents flowing through nodes Nc and Nd, respectively, and a read data producing circuit 50c for producing read data DAT in accordance with the output of current sense amplifier 50b. Reference current generating circuit 60 generates a reference current Ir on node Nd.

Current transmitting circuit 50a includes a voltage comparator 51 for comparing the voltage on node Na connected to the selected memory cell with a reference voltage Vref, and a transmitting transistor 52 electrically coupled between nodes Na and Nc. Transmitting transistor 52 is formed of an N-channel MOS transistor, and has a gate receiving the output of voltage comparator 51.

Current sense amplifier 50b includes P-channel MOS transistors 53 coupled between node Nc and power supply voltage Vcc, P-channel MOS transistor 54 coupled between node Nd and power supply voltage Vcc, and a main voltage comparator 70 for amplifying a voltage difference between nodes Nc and Nd to produce a read voltage VR. P-channel MOS transistors 53 and 54 have gates each connected to node Nd, and form a current mirror.

Read data producing circuit 50c includes a voltage comparator 80 for comparing read voltage VR output from main voltage comparator 70 with a reference voltage VrefA, a connection switch 85 for controlling connection between an output node of voltage comparator 80 and a node Nf, a voltage comparator 90 for comparing read voltage VR with reference voltage VrefB, a connection switch 95 for controlling connection between the output node of voltage comparator 80 and node Nf, and a voltage comparator 98 for producing read data DAT on a node Nh in accordance with a voltage difference between nodes Nf and Ng.

Current transmitting circuit 50a maintains the voltage on node Na, which is electrically coupled to the selected memory cell, at or around reference voltage Vref, and produces an access current Iac reflecting memory cell current Icell on node Nc. Consequently, access current Iac has two kinds of levels (I0 and I1) depending on the storage data level of the selected memory cell.

Reference current Ir passed through node Nd by reference current generating circuit 60 is set to a level intermediate between these two kinds of levels of access current Iac. Therefore, a voltage difference corresponding to a current difference between access current Iac and reference current Ir occurs between nodes Nc and Nd. Main voltage comparator 70 outputs read voltage VR, which is obtained by amplifying a voltage difference occurring between nodes Nc and Nd, on a node Ne.

In the data read operation, connection switch 85 connects the output node of voltage comparator 80 to a node Nf, and connection switch 95 connects the output node of voltage comparator 90 to a node Ng. Consequently, voltage comparator 98 produces read data DAT on node Nh in accordance with the output of each of voltage comparators 80 and 90.

Description will now be given on a structure of reference current generating circuit 60.

Reference current generating circuit 60 has dummy memory cells 61a and 61b, and also has a voltage comparator 62 and a transmitting transistor 63, which form a current transmitting circuit 60a.

Dummy memory cells 61a and 61b have structures similar to that of MTJ memory cell MC, and are connected in parallel between node Nb and ground voltage GND. Dummy memory cell 61a has a tunneling magneto-resistance element TMRd0 and an access transistor ATRd0, which are connected in series between node Nb and ground voltage GND. Similarly, dummy memory cell 61b has a tunneling magneto-resistance element TMRd1 and an access transistor ATRd1, which are connected in series between node Nb and ground voltage GND.

Tunneling magneto-resistance elements TMRd0 and TMRd1 are designed and manufactured similarly to tunneling magneto-resistance element TMR in MTJ memory cell MC. Likewise, each of access transistors ATRd0 and ATRd1 is designed and manufactured similarly to access transistor ATR in MTJ memory cell MC, and has a gate connected to a dummy word line DRWL. Thus, each of dummy memory cells 61a and 61b has a structure similar to that of MTJ memory cell MC. Further, write digit lines WDLd0 and WDLd1 are arranged for executing data writing on dummy memory cells 61a and 61b, respectively.

Data writing similar to that for the normal MTJ memory cell is already effected on dummy memory cells 61a and 61b so that electric resistances of tunneling magneto-resistance elements TMRd0 and TMRd1 are already set to Rmin and Rmax, respectively.

Voltage comparator 62 outputs a result of comparison between the voltage on node Nb and reference voltage Vref. Transmitting transistor 63 is formed of an N-channel MOS transistor electrically coupled between nodes Nb and N1.

In response to activation of dummy word line DRWL, a sum (I0+I1) of the currents flowing through dummy memory cells 61a and 61b flows through node Nb. Current transmitting circuit 60a can maintain the voltage on node Nb at or around reference voltage Vref, similarly to node Na coupled to the selected memory cell, and can transmit current (I0+I1) flowing through node Nb to node N1.

Reference current generating circuit 60 further includes a current producing circuit 60b for producing reference current Ir in accordance with the current flowing through node N1. Current producing circuit 60b includes P-channel MOS transistors 64 and 65 connected in parallel between power supply voltage Vcc and node N1, a P-channel MOS transistor 66 electrically coupled between power supply voltage Vcc and a node N2, an N-channel MOS transistor 67 electrically coupled between node Nd and ground voltage GND, and an N-channel MOS transistor 68 electrically coupled between node N2 and ground voltage GND.

Each of gates of P-channel MOS transistors 64, 65 and 66 is connected to node N1, and each of gates of N-channel MOS transistors 67 and 68 is coupled to node N2. A sum of the current drive powers of P-channel MOS transistors 64 and 65 is set to double the current drive power of P-channel MOS transistor 66.

Current producing circuit 60b having the above current mirror structure produces on node Nd a current, of which amount is equal to half the amount (I0+I1) of current transmitted to node N1. Thus, reference current Ir is set to (I0+I1)/2, which corresponds to a value intermediate between the two kinds of levels of memory cell current Icell. Accordingly, data read circuit 50 can read the storage data from the selected memory cell in accordance with a comparison between access current Iac and reference current Ir.

Reference current generating circuit 60 further has an N-channel MOS transistor 69, which is electrically coupled between node N2 and ground voltage GND, and receives on its gate an enable signal/EN3. Enable signal/EN3 is inactivated to attain H-level when reference current generating circuit 60 is to be stopped. In this case, node N2 is set to ground voltage GND in accordance with turn-on of transistor 69, and transistor 67 is forcedly turned off so that supply of reference current Ir stops.

While enable signal/EN3 is active and at L-level, reference current generating circuit 60 generates foregoing reference current Ir on node Nd.

Figure 4:
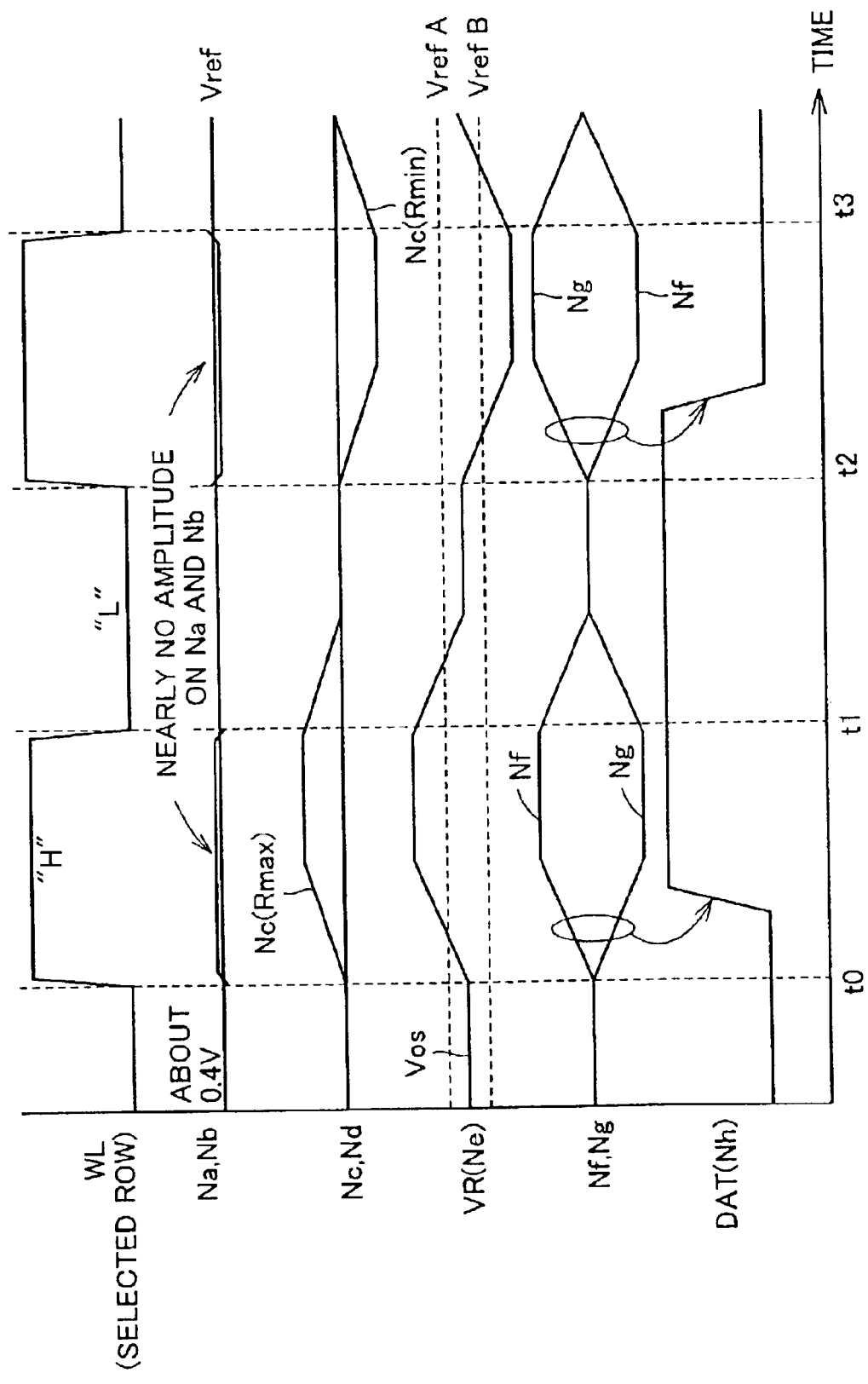
FIG. 4 is an operation waveform diagram showing a data read operation of a data read circuit shown in FIG. 3.

Referring to FIG. 4, when the data read operation starts at a time t0, word line WL in the selected row and dummy word line DRWL are activated to attain H-level. Further, column select line CSL in the selected column is activated to attain H-level in accordance with similar timing, although not shown.

In accordance with this, the selected memory cell is electrically coupled between node Na and ground voltage GND so that memory cell current Icell corresponding to the storage data of the selected memory cell passes through node Na. Similarly, dummy memory cells 61a and 61b are electrically coupled in parallel between node Nb and ground voltage GND so that a sum (I0+I1) of passing currents of dummy memory cells 61a and 61b flows through node Nb.

Owing to current transmitting circuits 50a and 60a, the voltages on node Na and Nb does not substantially change, and are maintained at or around reference voltage Vref. For example, in a general MRAM device, reference voltage Vref is set to about 0.4 V in view of, e.g., operation reliability of a tunneling film in the tunneling magneto-resistance element TMR. By maintaining constant voltages on nodes Na and Nb as described above, it is possible to suppress variations in electric resistance of tunneling magneto-resistance element TMR, and thereby a time required for stabilizing the passing current is reduced so that data reading can be performed fast.

Through node Nc, current transmitting circuit 50a passes access current Iac (I0 or I1) corresponding to the storage data level of the selected memory cell. Through node Nd, current transmitting circuit 60a passes reference current Ir (=(I0+I1)/2). Therefore, a voltage difference corresponding to the storage data level of the selected memory cell occurs between nodes Nc and Nd. For example, when the storage data of the selected memory cell is at H-level (electric resistance Rmax), the voltage on node Nc is higher than that on node Nd.

Main voltage comparator 70 produces read voltage VR on node Ne by amplifying a voltage difference thus occurred between nodes Nc and Nd. Read voltage VR applied from main voltage comparator 70 is compared with reference voltages VrefA and VrefB by voltage comparators 80 and 90, respectively.

Voltage comparator 98 latches the outputs of voltage comparators 80 and 90 having incomplete amplitudes in accordance with predetermined timing. Further, voltage comparator 98 amplifies the outputs thus latched to the full amplitude level, and sets the voltage on node Nh to either power supply voltage Vcc or ground voltage GND. Thus, voltage comparator 98 sets read data DAT to either H-level or L-level. During the data read operation between times t0 and t1, as described above, read data DAT at H-level is produced in accordance with the storage data of the selected memory cell.

During a period between times t2 and t3, the storage data of the selected memory cell is at L-level according to the operation waveform shown in the figure. In this case, the voltages on nodes Na-Nh change oppositely in polarity to those during the data read operation between times t0 and t1. Finally, read data DAT at L-level (ground voltage GND) is produced on node Nh.

Description will now be given on a structure for evaluating and controlling offset of current sense amplifier 50b.

When the data read operation is inactive, read voltage VR is kept at a level corresponding to the offset of current sense amplifier 50b. Therefore, the level of read voltage VR during the inactive state of data read operation may be referred to as an "offset voltage Vos".

As already described, the current difference between access current Iac (memory cell current Icell) and reference current Ir is on the order of microamperes ($\mu$A). For ensuring the data read accuracy, therefore, it is necessary to suppress the offset of current sense amplifier 50b to be lower than a predetermined level. In an ideal state where the offset in not present, offset voltage Vos is fixed to a constant intermediate value. Reference voltages VrefA and VrefB in voltage comparators 80 and 90 are set to levels, respectively, which are close to each other with the above intermediate value therebetween, and correspond to the offset allowed range.

In the following description, these reference voltages VrefA and VrefB will be referred to as "offset reference voltages VrefA and VrefB" for discrimination from reference voltages Vref in current transmitting circuits 50a and 60a, respectively.

In other words, when the offset of current sense amplifier 50b is in an allowed ranged, and the data read operation is inactive (word line WL is inactive), offset voltage Vos is intermediate between offset reference voltages VrefA and VrefB.

Referring to FIG. 3 again, the structure according to the first embodiment further includes a test current supply circuit 100 and current switching circuits 120 and 130, which are used in a test mode for offset tuning.

Test current supply circuit 100 has an externally and electrically connectable pad 102, a constant current generating circuit 105 for generating a constant current corresponding to a voltage applied to pad 102, and an N-channel MOS transistor 110 electrically coupled between constant current generating circuit 105 and ground voltage GND.

Current switching circuit 120 has N-channel MOS transistors 122 and 125, which are connected in series between node Nc and ground voltage GND. Current switching circuit 130 has N-channel MOS transistors 132 and 135, which are connected in series between node Nd and ground voltage GND. Each of gates of transistors 110, 122 and 132 is coupled to a connection node between transistor 110 and constant current generating circuit 105. Transistors 125 and 135 receive enable signals EN4 and EN5 on their gates, respectively. In the data read operation, enable signals EN4 and EN5 are inactivated to attain L-level so that current switching circuits 120 and 130 isolate test current supply circuit 100 from nodes Nc and Nd, respectively.

Figure 5:
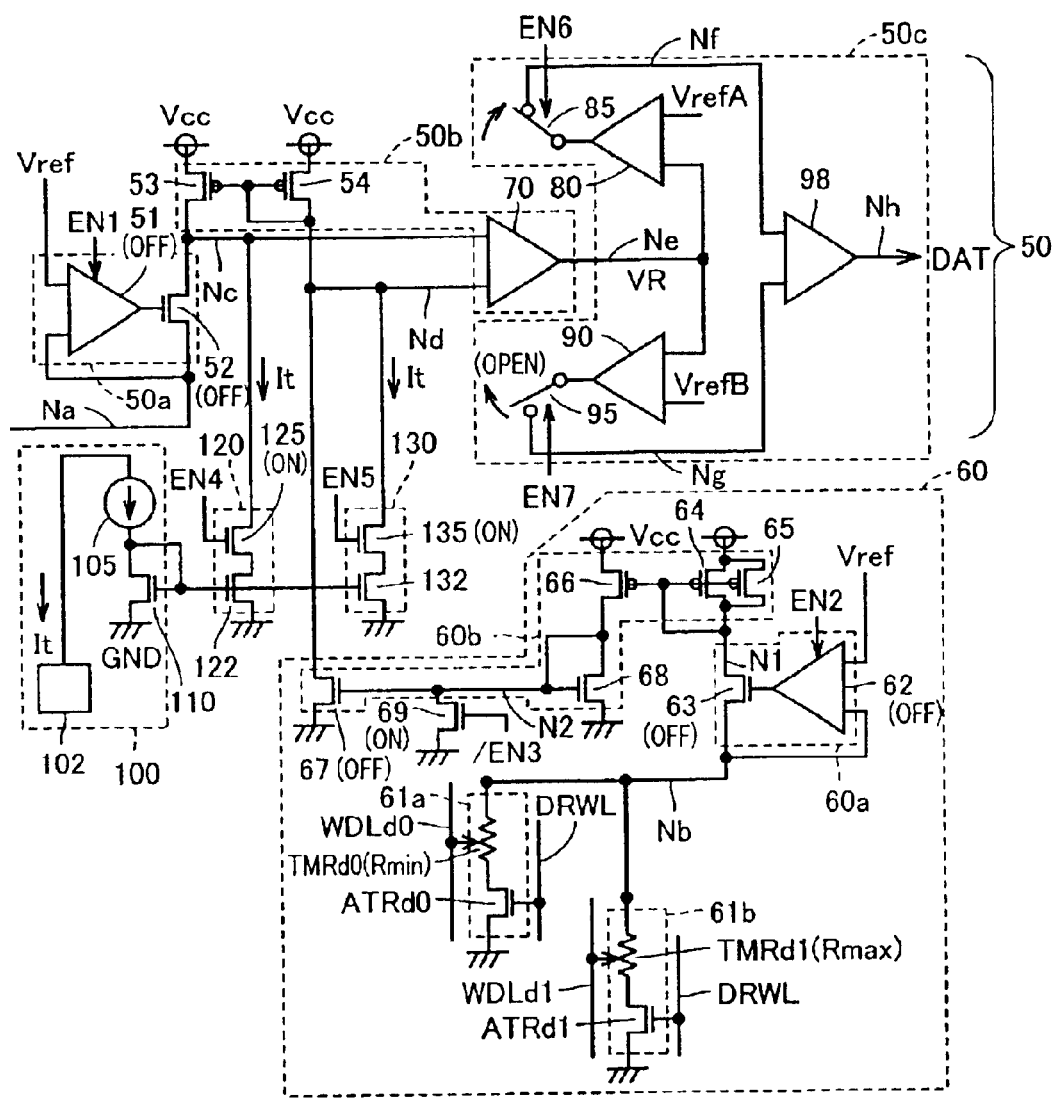
FIG. 5 is a circuit diagram showing an operation of the data read circuit system in a first test state of a test mode according to the first embodiment.

Referring to FIG. 5, in the test mode according to the first embodiment, enable signals EN4 and EN5 are activated to attain H-level, and each of transistors 125 and 135 is turned on. Thereby, current switch circuits 120 and 130 transmit a test current It, which corresponds to the voltage applied to pad 102, to nodes Nc and Nd, respectively.

Each of enable signals EN1, EN2 and /EN3 is inactivated. In accordance with this, voltage comparators 51 and 62 stop their operations, and reference current generating circuit 60 stops supply of reference current Ir. Likewise, current transmitting circuit 50a does not transmit access current Iac to node Nc. In the test mode, therefore, only the same test current It is supplied to nodes Nc and Nd. In the test mode according to the first embodiment, as described above, the offset of main voltage comparator 70 is evaluated in such a state that no current difference is present between nodes Nc and Nd.

In a first test state of the test mode according to the first embodiment, as shown in FIG. 5, enable signals EN6 and EN7 are set such that connection switch 85 connects the output node of voltage comparator 80 to node Nf, and connection switch 95 sets the output node of voltage comparator 90 to an open state. In the first test state shown in FIG. 5, it is thereby possible to determine whether the voltage on node Ne, i.e., offset voltage Vos exceeds offset reference voltage VrefA or not, based on read data DAT output from read data producing circuit 50c.

Figure 6:
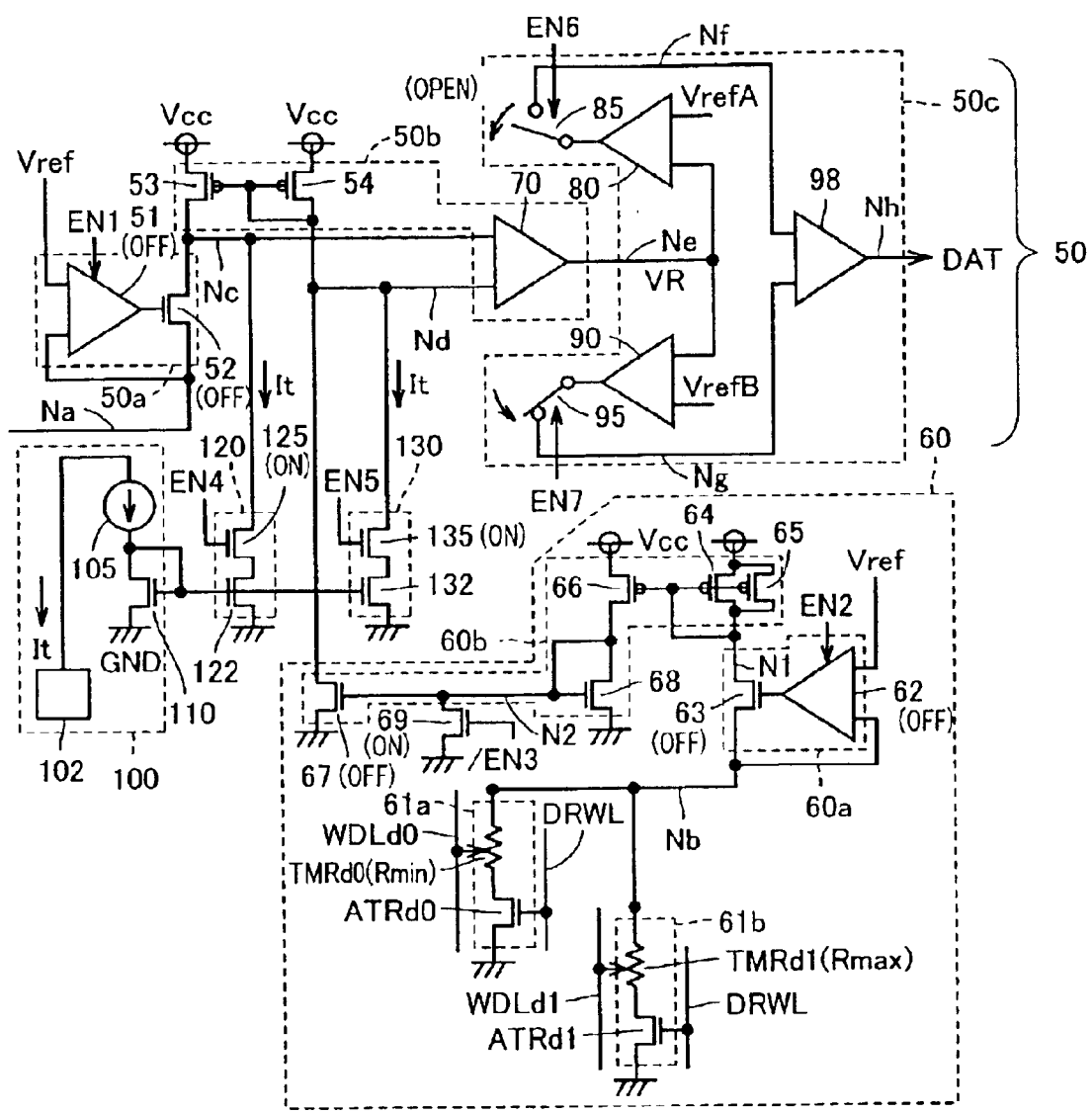
FIG. 6 is a circuit diagram showing an operation of the data read circuit system in a second test state of the test mode according to the first embodiment.

In a second test state of the test mode according to the first embodiment, as shown in FIG. 6, setting of enable signals EN6 and EN7 are changed so that connection switch 85 sets the output node of voltage comparator 80 to the open state, and connection switch 95 connects the output node of voltage comparator 90 to node Ng. Portions of the data read circuit system other than the above are set to states similar to those shown in FIG. 5.

In the second test state, therefore, it is determined whether offset voltage Vos is lower than reference voltage VrefB or not, based on read data DAT output from read data producing circuit 50c.

Therefore, the first test state shown in FIG. 5 and the second test state shown in FIG. 6 are repeated so that evaluation can be performed by determining only whether offset voltage Vos produced on node Ne is between offset reference voltage VrefA and VrefB or not, and thus whether the offset of current sense amplifier 50b alone falls within a predetermined range or not. In the test mode according to the first embodiment, read data producing circuit 50c has a function of evaluating the offset of current sense amplifier 50b alone.

In the design stage, the offset of current sense amplifier 50b is determined to fall within a predetermined range. However, due to an influence, e.g., by variations in manufacturing process of the MRAM device, offset may occur even when equal currents flows through nodes Nc and Nd, respectively. In the state where this offset is present, it becomes difficult to amplify accurately a minute current difference between nodes Nc and Nd for executing accurate data reading. The offset of current sense amplifier 50b can be tuned by the offset of main voltage comparator 70, which is provided for comparing the voltages on nodes Nc and Nd with each other.

Therefore, structures for tuning the offset of main voltage comparator 70 will now be described.

Figure 7:
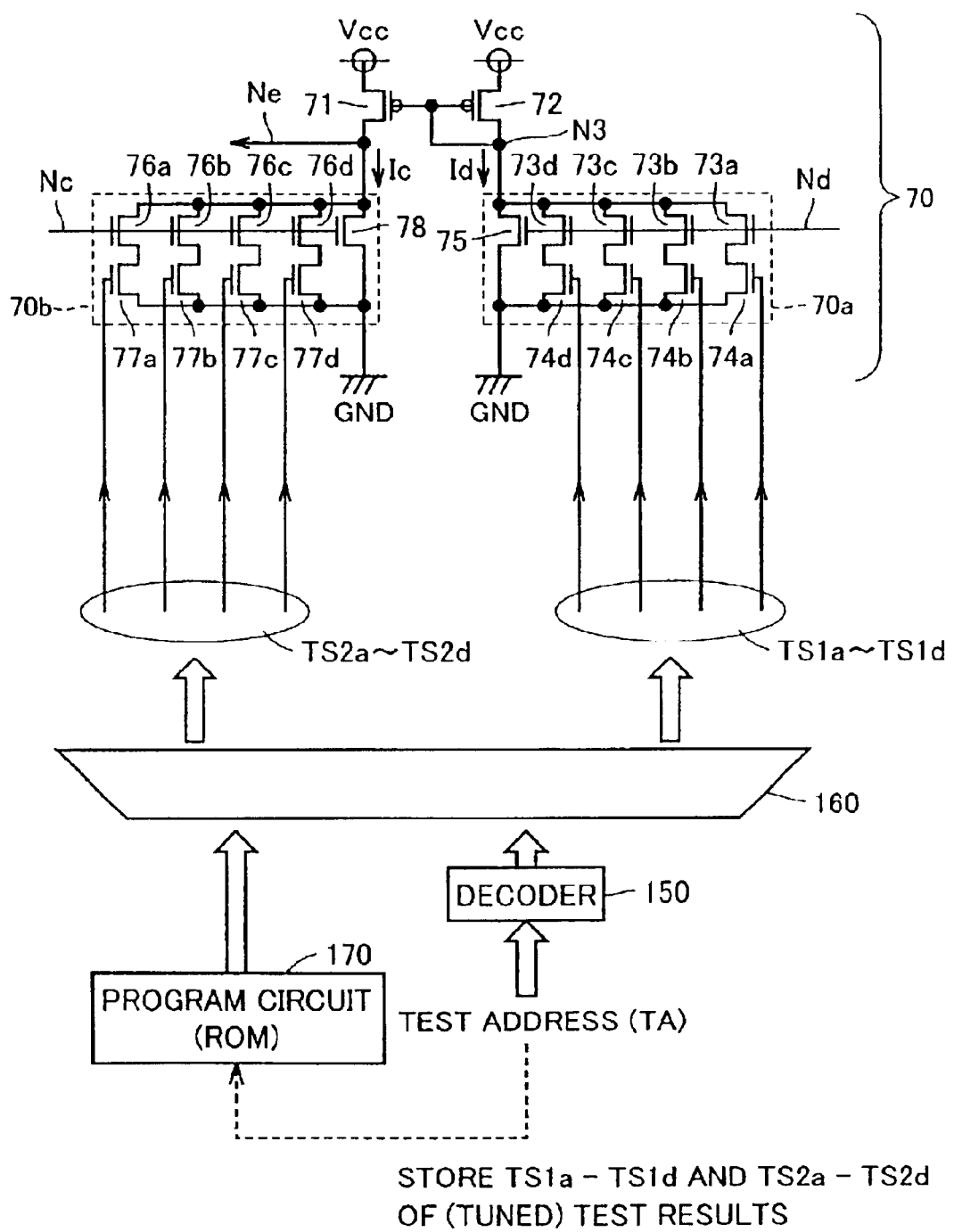
FIG. 7 is a circuit diagram showing a structure of a voltage comparator shown in FIG. 3 and a structure for controlling offset of a current sense amplifier.

Referring to FIG. 7, main voltage comparator 70 includes a P-channel MOS transistor 71 electrically coupled between power supply voltage Vcc and node Ne, a P-channel MOS transistor 72 electrically coupled between power supply voltage Vcc and node N3, an impedance tuning circuit 70a for tuning the input impedance of node Nd, and an impedance tuning circuit 70b for tuning the input impedance of node Nc.

Impedance tuning circuit 70a has N-channel MOS transistors 73a, 73b, 73c, 73d and 75 having gates connected to node Nd, and N-channel MOS transistors 74a, 74b, 74c and 74d having gates receiving control signals TS1a–TS1d, respectively. Transistor 75 is electrically coupled between node N3 and ground voltage GND. Transistors 73a and 74a are connected in series between node N3 and ground voltage GND. Likewise, transistors 73b and 74b are connected in series between node N3 and ground voltage GND, transistors 73c and 74c are connected in series between node N3 and ground voltage GND, and transistors 73d and 74d are connected in series between node N3 and ground voltage GND.

Impedance tuning circuit 70b has N-channel MOS transistors 76a, 76b, 76c, 76d and 78 having gates connected to node Nc, and also has N-channel MOS transistors 77a, 77b, 77c and 77d having gates for receiving control signals TS2a–TS2d, respectively. Transistor 78 is electrically coupled between node Ne and ground voltage GND. Transistors 76a and 77a are connected in series between node Ne and ground voltage GND. Likewise, transistors 76b and 77b are connected in series between node Ne and ground voltage GND, transistors 76c and 77c are connected in series between node Ne and ground voltage GND, and transistors 76d and 77d are connected in series between node Ne and ground voltage GND.

Decoder 150 produces control signals TS1a–TS1d and TS2a–TS2d in accordance with a test address TA which are externally input in the test mode. Selector circuit 160 in the test mode transmits control signals TS1a–TS1d and TS2a–TS2d produced by decoder 150 to main voltage comparator 70.

In main voltage comparator 70, P-channel MOS transistors 71 and 72 form a current mirror. Therefore, current Ic flowing through node Ne depends on the voltage on node Nc and the number of transistor(s), which are on in accordance with control signals TS2a–TS2d, among transistors 77a–77d. Likewise, current Id flowing through node N3 depends on the voltage on node Nd and the number of transistor(s), which are on in accordance with control signals TS1a–TS1d, among transistors 74a–74d.

More specifically, impedance tuning circuit 70a can tune the internal impedance of main voltage comparator 70 corresponding to node Nd in accordance with control signals TS1a–TS1d. Likewise, impedance tuning circuit 70b can tune the internal impedance of main voltage comparator 70 corresponding to node Nc in accordance with control signals TS2a–TS2d. More specifically, the node for the turned-on N-channel MOS transistors, which are larger in number than those for the other node, has a lower internal impedance than the other node. As a result, the input impedances of nodes Nd and Nc are tuned in accordance with control signals TS1a–TS1d and TS2a–TS2d.

In the test mode according to the first embodiment, nodes Nc and Nd are supplied with the same current. Under this situation, a balance of the internal impedances of main voltage comparator 70 is set by control signals TS1a–TS1d and TS2a–TS2d corresponding to externally applied test address TA. Further, by repeating the first and second test states shown in FIGS. 5 and 6, an operation test is executed to evaluate whether the offset of main voltage comparator 70 falls within an allowed range or not, based on the balance of the internal impedances of main voltage comparator 70 corresponding to test address TA used in the test. When the voltage on node Ne, i.e., offset voltage Vos does not fall within a predetermined range (VrefB<Vos<VrefA), test address TA is changed, and the operation test is executed again. The operation test is repeated with different test addresses until offset voltage Vos falls within the predetermined range.

When a combination of bits of test address TA, which can tune the offset of main voltage comparator 70 to fall within the allowed range, is determined as a result of the operation test, and thus when tuning of control signals TS1a–TS1d and TS2a–TS2d are completed as a result of the operation test, tuned control signals TS1a–TS1d and TS2a–TS2d are stored in a program circuit 170. Program circuit 170 is formed of, e.g., a Read-Only Memory (ROM).

In the normal operation, selector circuit 160 transmits control signals TS1a–TS1d and TS2a–TS2d stored in program circuit 170 to main voltage comparator 70. In the normal operation, therefore, the data read operation is executed under the situations that the offset of main voltage comparator 70 is suppressed to be within the allowed range in accordance with tuned control signals TS1a–TS1d and TS2a–TS2d stored in program circuit 170.

According to the structure of the first embodiment, the balance of internal impedances of the voltage comparator is tuned, whereby it is possible to tune precisely the offset of the current sense amplifier, which is provided for extracting a current difference between the passing current of the selected memory cell and the reference current. As a result, minute current difference can be detected to execute accurate data reading.

The first embodiment has been described in connection with the structure, which employs a dedicated test mode for executing the offset tuning of the current sense amplifier by tuning the impedances of main voltage comparator 70. However, such a structure may be employed that the test mode automatically starts in a self-test-like manner, e.g., upon power-on. In this case, program circuit 170 for storing tuned control signals TS1a–TS1d and TS2a–TS2d is not required to perform nonvolatile data storing so that program circuit 170 can be formed of a register such as a latch circuit, which holds the data while the power is on.

FIG. 7 shows the structure, in which the offset tuning is performed with four control signals TS1a–TS1d or TS2a–TS2d at a time. However, the number of the control signals is no restricted. Thus, it is merely required in the structure shown in FIG. 7 that the number of transistor groups corresponding to transistors 73a–73d, 74a–74d, 76a–76d and 77a–77d corresponds to the number of the control signals.

Second Embodiment

A second embodiment will now be described in connection with a structure of a test mode for tuning reference current Ir while following manufacturing variations of the MTJ memory cells.

Figure 8:
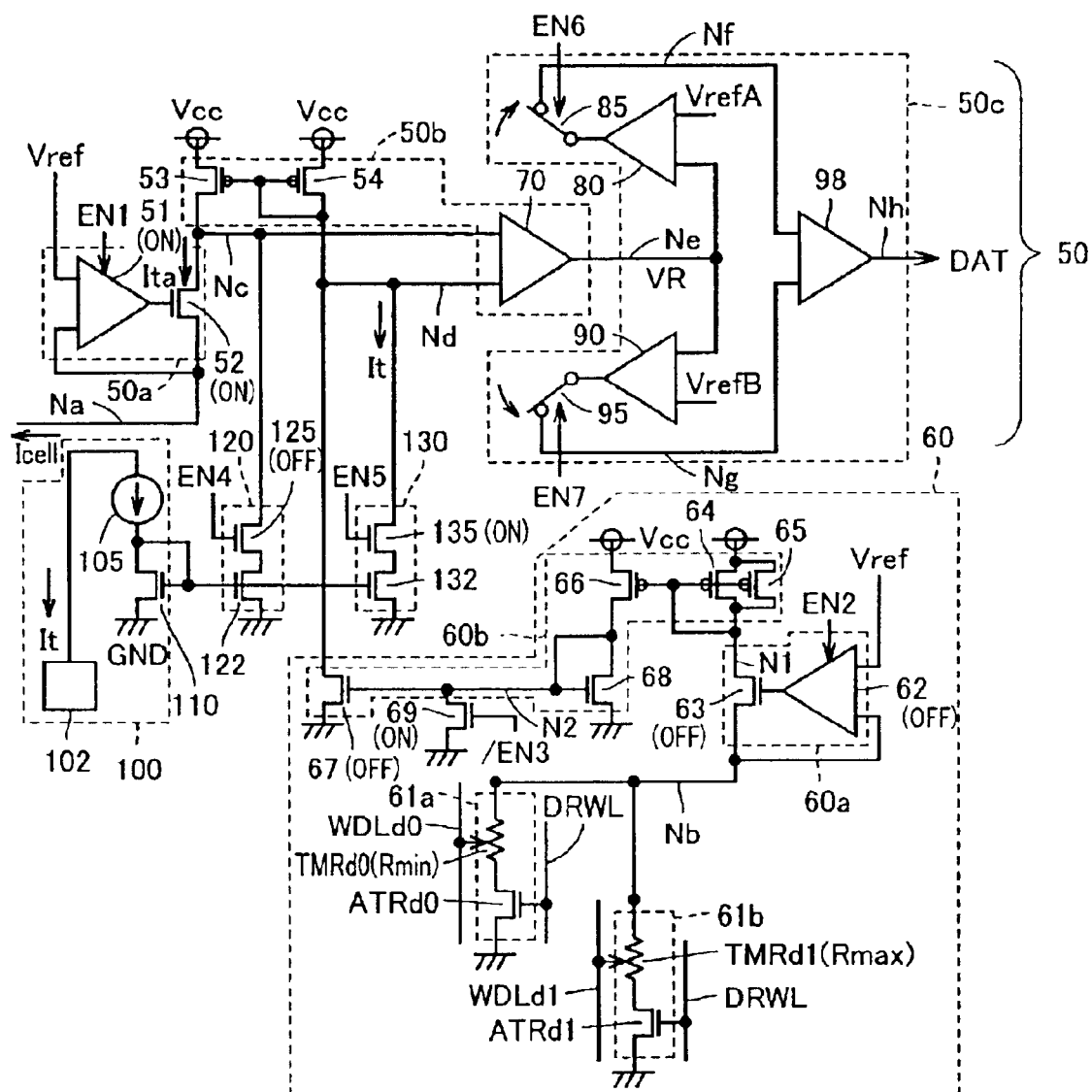
FIG. 8 is a circuit diagram showing the first test state of the test mode according to a second embodiment.

FIG. 8 shows a first test state of the test mode according to the second embodiment.

Referring to FIG. 8, structures of data read circuit 50, reference current generating circuit 60, test current supply circuit 100 and current switching circuits 120 and 130, which form the data read circuit system for executing the data read operation, are similar to those shown in FIG. 2, and therefore description thereof is not repeated.

In the test mode according to the second embodiment, enable signals EN1–EN7 are set such that various portions may attain states different from those in the normal data read operation.

In a first test state of the test mode according to the second embodiment, the operation test is likewise executed for determining a distribution of the passing currents of the MTJ memory cells. Therefore, enable signal EN1 is activated, and enable signal EN2 is inactivated. Therefore, current transmitting circuit 50a formed of voltage comparator 51 and transmitting transistor 52 operates in a manner similar to that in the data read operation. However, current transmitting circuit 60a formed of voltage comparator 62 and transmitting transistor 63 stops its operation. Further, enable signal /EN3 is inactivated to attain H-level so that transistor 69 is turned on, and transistor 67 is turned off. Thereby, reference current generating circuit 60 is electrically isolated from node Nd.

Further, enable signals EN4 and EN5 become inactive (L-level) and active (H-level), respectively. In accordance with this, transistor 125 is turned off, and transistor 135 is turned on. Consequently, in the first test state according to the second embodiment, node Nc is supplied with access current Iac corresponding to memory cell current Icell, which passes through the selected memory cell, and node Nd is supplied with test current It from test current supply circuit 100.

As a result, read data DAT produced by data read circuit 50 has a level corresponding to a relationship in magnitude between access current Iac and test current It. By changing the level of test current It stepwise, therefore, it is possible to measure the level of passing current (memory cell current Icell) of the selected memory cell storing the H-level or L-level data. By repeating the above operation test, a map representing a distribution of memory cell current Icell at the time of access can be prepared in the first test state of the test mode according to the second embodiment.

Figure 9A:
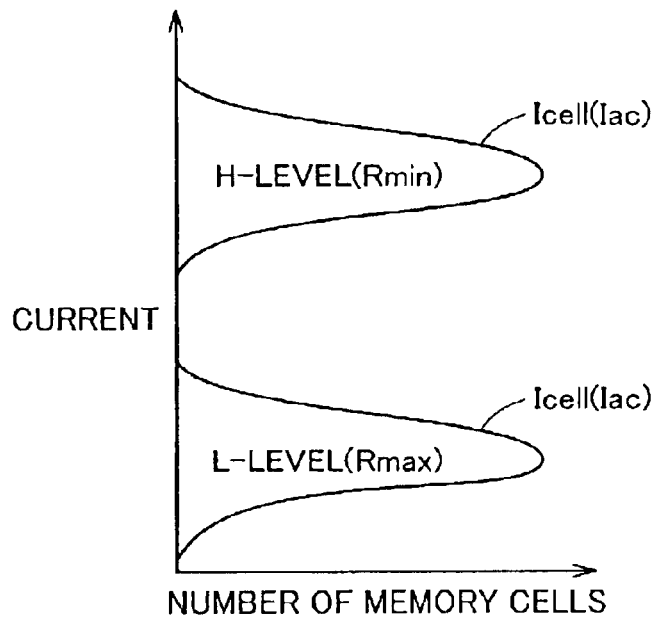
FIGS. 9A and 9B are first and second diagrams conceptually showing a tuning manner in the test mode according to the second embodiment.

FIG. 9A shows distributions of memory cell current Icell in the MTJ memory cells according to the storage data. As shown therein, two kinds of memory cell current Icell are present depending on the level of the storage data, but the memory cell current Icell corresponding to each level is distributed to a certain extent due to an influence of manufacturing variations.

As already described, reference current generating circuit 60 includes dummy memory cells 61a and 61b, which are designed and prepared similarly to MTJ memory cell MC, and current transmitting circuit 60a having a structure similar to current transmitting circuit 50a corresponding to the selected memory cell. In the design, the manufacturing variations of the MTJ memory cell can be absorbed, and the reference current Ir can be set to the center of each distribution of the memory cell passing current corresponding to each storage data level.

Figure 9B:
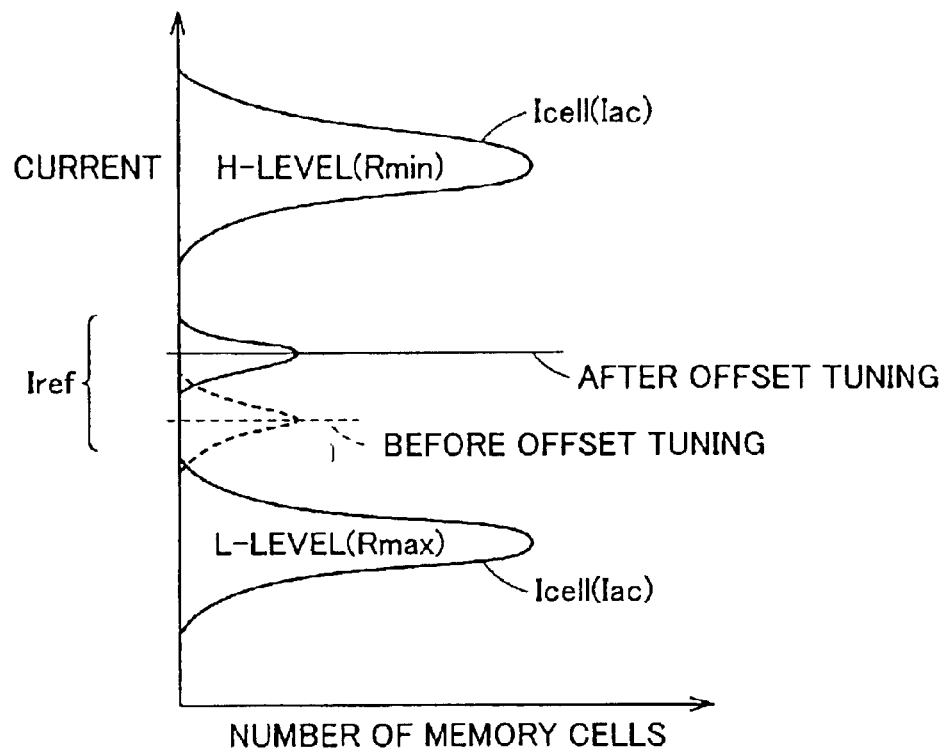

However, if offset is present in current transmitting circuit 60a within reference current generating circuit 60, it may be impossible to set reference current Ir to a correct level, as shown by dotted line in FIG. 9B.

In a second test state of the test mode according to the second embodiment, tuning is performs to set reference current Ir to an appropriate level by tuning such offset in reference current generating circuit 60.

Figure 10:
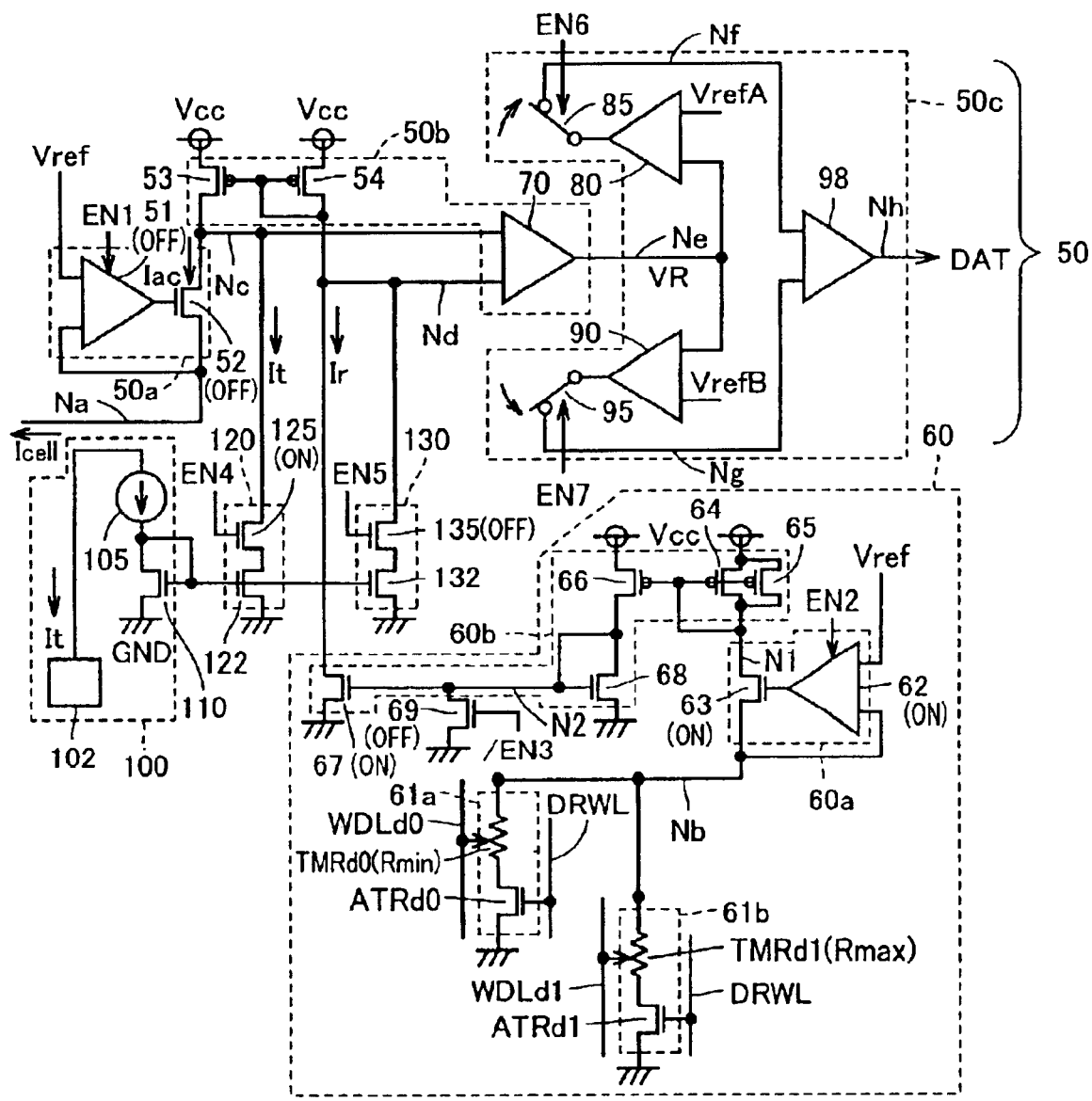
FIG. 10 is a circuit diagram showing the second test state of the test mode according to the second embodiment.

Referring to FIG. 10, the second test state of the test mode according to the second embodiment differs from the first test state of the test mode in that settings of enable signals EN4 and EN5 are interchanged. In accordance with this, transistor 125 is turned on, and transistor 135 is turned off. Further, enable signal/EN3 is activated to attain L-level so that transistor 69 is turned off. Thereby, the gate of transistor 67 is isolated from ground voltage GND.

In the second test state of the test mode according to the second embodiment, node Nd is supplied with reference current Ir produced by reference current generating circuit 60, and node Nc is supplied with test current It from test current supply circuit 100.

As a result, read data DAT produced by data read circuit 50 has a level corresponding to the relationship in magnitude between the reference current Ir and test current It. Accordingly, by repeating the operation test for determining the level of read data DAT while changing test current It stepwise, reference current Ir can be measured in the second test state of the test mode according to the second embodiment.

In the test mode according to the second embodiment, as described above, read data producing circuit 50c has a function of individually detecting the relationship in magnitude of each of access current Iac (i.e., memory cell passing current Icell) and reference current Ir with respect to externally tunable test current It.

Figure 11:
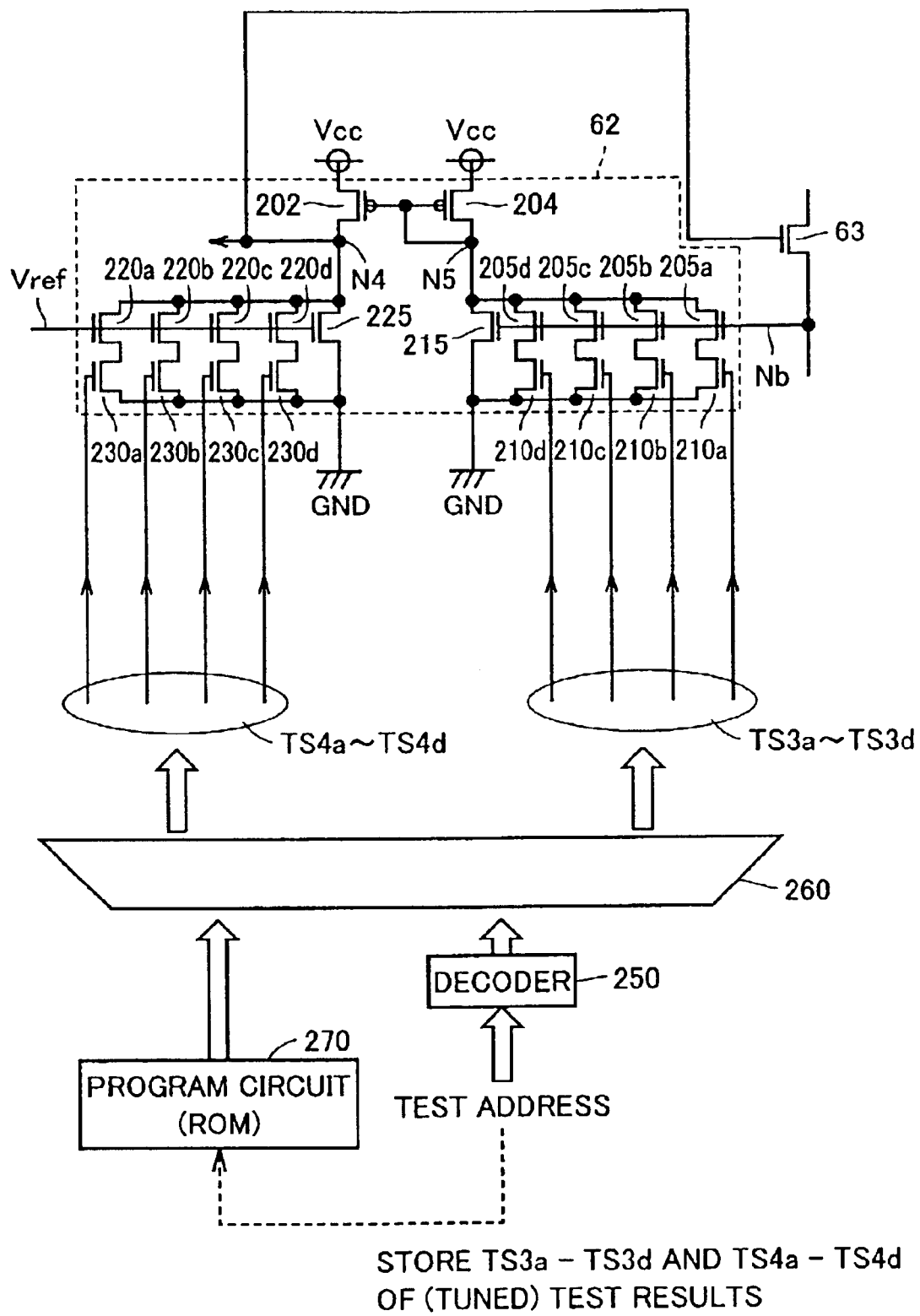
FIG. 11 is a circuit diagram showing a voltage comparator and a structure for controlling its internal impedance.

Referring to FIG. 11, voltage comparator 62 has a structure similar to main voltage comparator 70 shown in FIG. 7, and has an internal impedance balance, which is tuned in accordance with control signals TS3a–TS3d ad TS4a–TS4d.

Voltage comparator 62 has a P-channel MOS transistor 202 electrically coupled between power supply voltage Vcc and a node N4, a P-channel MOS transistor 204 electrically coupled between power supply voltage Vcc and a node N5, N-channel MOS transistors 205a, 205b, 205c, 205d and 215 having gates connected to node Nb, and N-channel MOS transistors 210a–210d receiving control signals TS3a–TS3d on their gates, respectively. Transistor 215 is electrically coupled between node N5 and ground voltage GND. Transistors 205a and 210a are connected in series between node N5 and ground voltage GND. Likewise, transistors 205b and 210b are connected in series between node N5 and ground voltage GND, transistors 205c and 210c are connected in series between node N5 and ground voltage GND, and transistors 205d and 210d are connected in series between node N5 and ground voltage GND. Node N4 is connected to a gate of transmitting transistor 63.

Voltage comparator 62 further has N-channel MOS transistors 220a, 220b, 220c, 220d and 225 each having a gate receiving reference voltage Vref, and N-channel MOS transistors 230a–230d receiving control signals TS4a–TS4d on their gates, respectively. Transistor 225 is electrically coupled between node N4 and ground voltage GND. Likewise, transistors 220b and 230b are connected in series between node N4 and ground voltage GND, transistors 220c and 230c are connected in series between node N4 and ground voltage GND, and transistors 220d and 230d are connected in series between node N4 and ground voltage GND.

Decoder 250 produces control signals TS3a–TS3d and TS4a–TS4d in accordance with test address TA, which is externally applied in the test mode. Selector circuit 260 transmits control signals TS3a–TS3d and TS4a–TS4d produced by decoder 250 to voltage comparator 62 in the test mode.

Owing to the above structure, the internal impedances of voltage comparator 62 are tuned in a manner similar to the impedance tuning of main voltage comparator 70 shown in FIG. 10. Thereby, the input impedance of current transmitting circuit 60a for producing reference current Ir can be tuned to change the level of reference current Ir.

In the second test state of the test mode according to the second embodiment, test current (It) is changed stepwise so that the level of reference current Ir corresponding to input test address TA can be determined. Tuning of the internal impedance of voltage comparator 62 is continued so that reference current Ir may be located at the center of the distribution of passing current at each of storage data levels, while giving consideration to the distribution of memory cell current Icell determined in the first test state.

The above tuning test is repeated, and program circuit 270 stores the states of control signals TS3a–TS3d and TS4a–TS4d corresponding to reference current Ir, which is set to the optimum level.

As described above, the structure of the second embodiment can precisely tune the offset of the reference current generating circuit. Consequently, reference current Ir can be set correctly so that the data reading can be precisely performed based on a minute current difference.

The second embodiment has been described in connection with the structure, in which the dedicated test mode is employed for tuning the reference current Ir by tuning the internal impedances of voltage comparator 62. However, such a structure may be employed that the test mode automatically starts in a self-test-like manner, e.g., upon power-on. In this case, program circuit 270 for storing tuned control signals TS3a–TS3d and TS4a–TS4d is not required to perform nonvolatile data storing so that program circuit 270 can be formed of a register such as a latch circuit, which holds the data while the power is on. FIG. 11 shows a structure, in which the offset tuning is performed with four control signals TS3a–TS3d or TS4a–TS4d at a time. However, the number of the control signals is no restricted. Thus, it is merely required in the structure shown in FIG. 11 that the number of transistor groups corresponding to transistors 205a–205d, 210a–210d, 220a–220d and 230a–230d corresponds to the number of the control signals.

Third Embodiment

A third embodiment will now be described in connection with a circuit structure for automatically performing the offset tuning of main voltage comparator 70, which is already described in connection with the first embodiment, when the data read operation is inactive (e.g., during a precharging operation).

Figure 12:
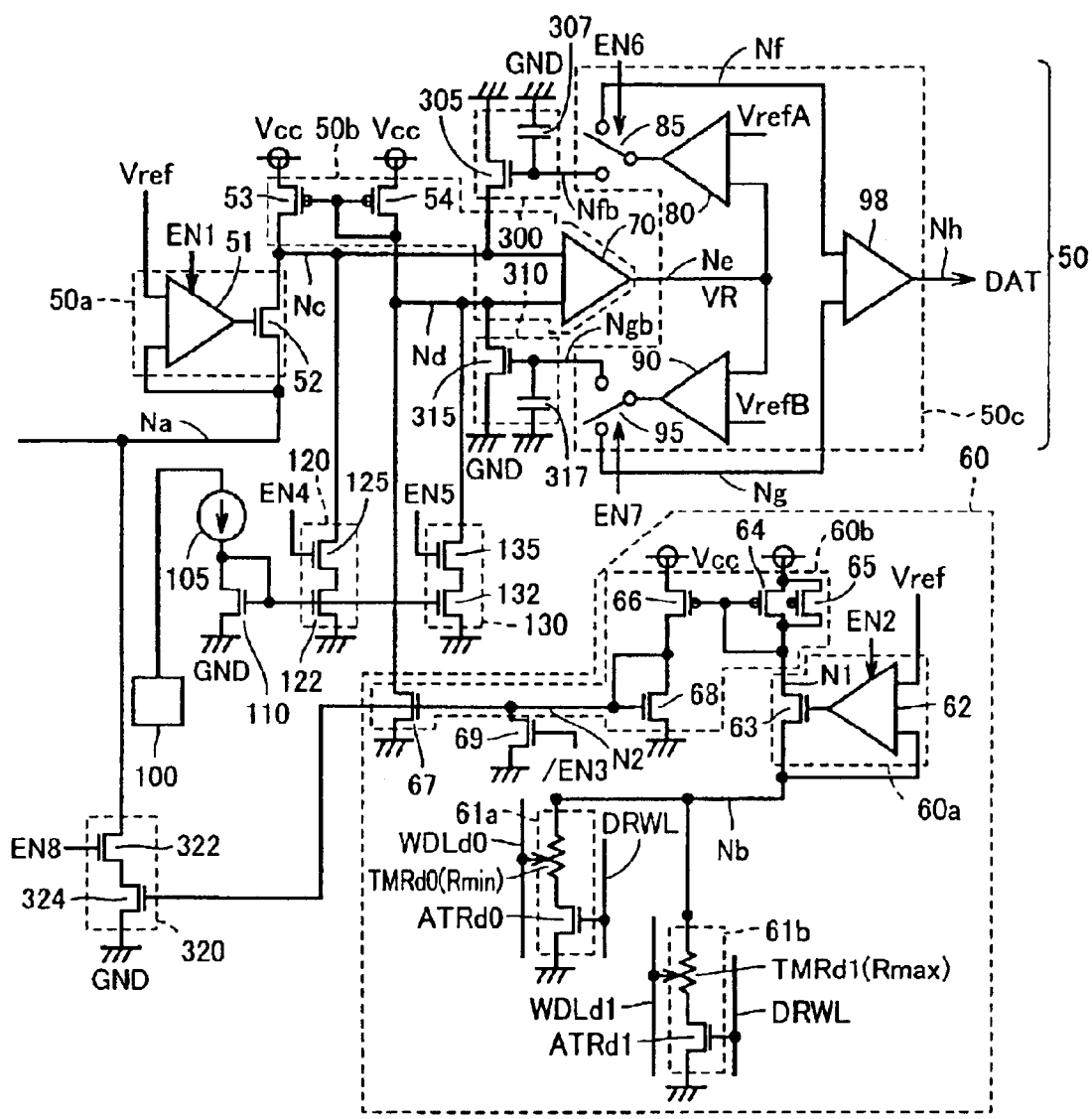
FIG. 12 is a circuit diagram showing a structure of a data read circuit system according to a third embodiment of the invention.

FIG. 12 shows a structure of a data read circuit system according to the third embodiment.

Referring to FIG. 12, the structure of the third embodiment includes offset tuning circuits 300 and 310 and a current switching circuit 320 in addition to the structure of the data read circuit system of the first embodiment shown in FIG. 2.

Offset tuning circuit 300 has a tuning current producing transistor 305 for flowing a current corresponding to a voltage Vf1 on a node Nfb from node Nc, and a capacitor 307 for holding voltage Vf1 on node Nfb. Tuning current producing transistor 305 is formed of an N-channel MOS transistor electrically coupled between node Nc and ground voltage GND.

Likewise, offset tuning circuit 310 has a tuning current producing transistor 315 for supplying a current corresponding to a voltage Vf2 on a node Ngb from node Nd, and a capacitor 317 for holding voltage Vf2 on node Ngb. Tuning current producing transistor 315 is formed of an N-channel MOS transistor, which is electrically coupled between node Nd and ground voltage GND.

Current switching circuit 320 has N-channel MOS transistors 322 and 324 connected in series between node Na and ground voltage GND. Transistor 322 receives an enable signal EN8 on its gate. A gate of transistor 324 is connected to node N2.

Figure 13:
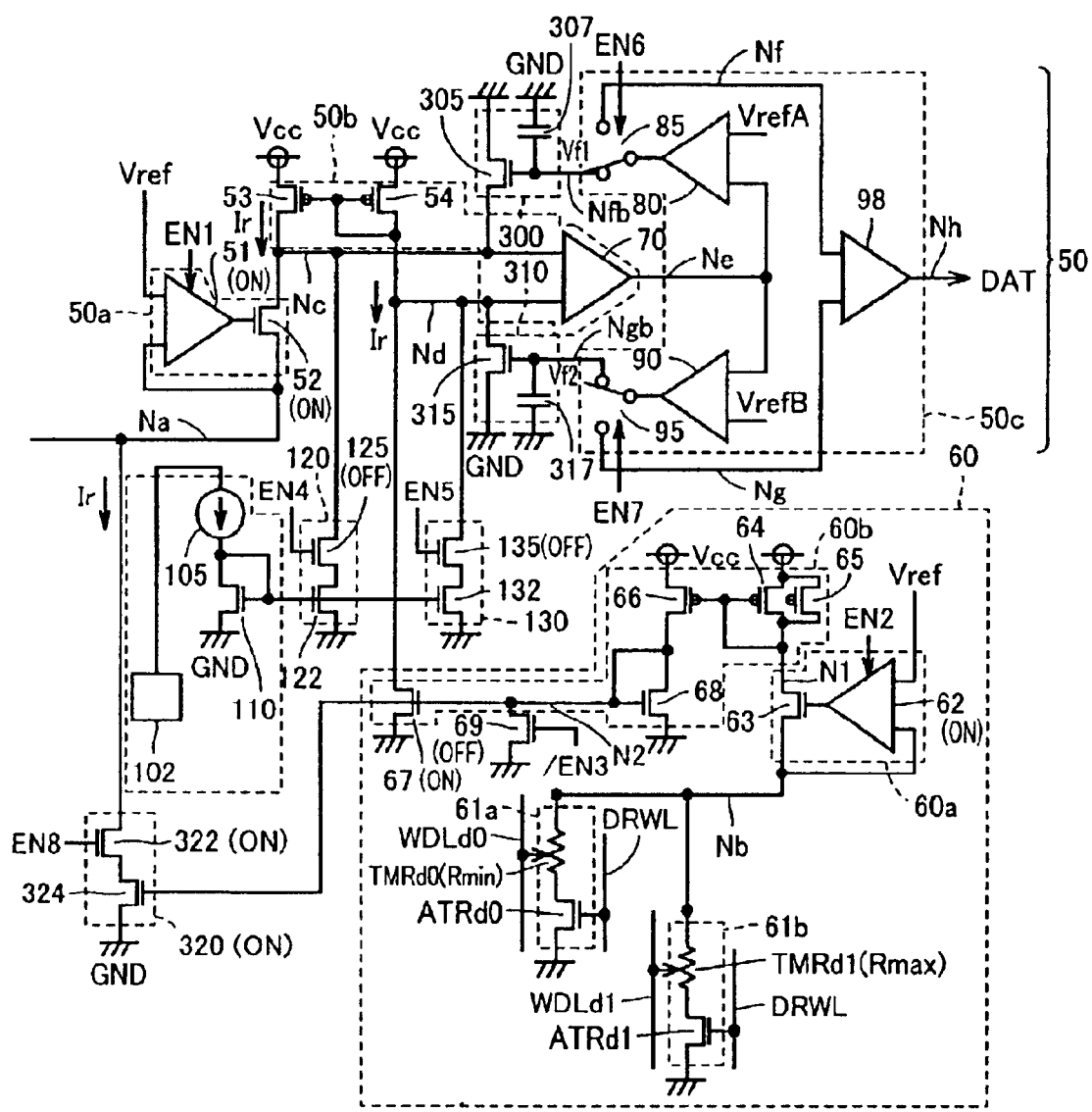
FIG. 13 is a circuit diagram showing a state of the data read circuit system during an inactive state of the data read operation according to the third embodiment.

FIG. 13 shows a state, in which the data read operation of the data read circuit system according to the third embodiment is inactive.

Referring to FIG. 13, enable signal EN8 is inactive and at L-level during data reading, and is active and at H-level when the data read operation is inactive for performing, e.g., a precharge operation. Therefore, when the data read operation is inactive, current switching circuit 320 carries reference current Ir to node Nd. As a result, the same reference current Ir flows through each of nodes Nc and Nd.

When the data read operation is inactive, connection switches 85 and 95 connect the output nodes of voltage comparators 80 and 90 to nodes Nfb and Ngb in accordance with enable signals EN6 and EN7 so as to form a feedback loop of read voltage VR output from main voltage comparator 70, respectively.

According to the above structure of the third embodiment, a feedback path of read voltage VR is formed for automatically tuning voltages Vf1 and Vf2 on nodes Nfb and Ngb so that read voltage VR output from main voltage comparator 70 falls within a range between reference voltages VrefA and VrefB, and thus the offset of main voltage comparator 70 may fall within a predetermined level range while the same current is flowing through each of nodes Nc and Nd during the inactive state of data read operation.

For example, when such offset is present that raises the voltage on node Nc (on the side of access current Iac) relatively to the voltage on node Nd (on the side of reference current Ir), the output of main voltage comparator 70 changes to the H-level side, and rises above reference voltage VrefA. In accordance with this, the output of voltage comparator 80 changes toward the H-level side so that voltage Vf1 on node Nfb rises. Thereby, tuning current producing transistor 305 increases the current flowing from node Nc, and a feedback loop relatively lowering the voltage on node Nc is formed.

As described above, tuning current producing transistors 305 and 315 cause the currents corresponding to voltages Vf1 and Vf2 on nodes Nfb and Ngb to flow from nodes Nc and Nd, respectively. Thereby, the balance of input impedances of nodes Nc and Nd are tuned so that the offset of main voltage comparator 70 may fall within a predetermined range, and thus the offset of current sense amplifier 50b may fall within a predetermined range.

Tuning current producing circuits 305 and 315 can be formed of P-channel MOS transistors, which are connected between power supply voltage Vcc and node Nc or Nd. In this case, the polarities of the output voltages of voltage comparators 80 and 90 forming the feedback loop must be inverted from those in the structure shown in FIG. 13. In this structure, tuning current producing circuit 305 supplies a current corresponding to voltage Vf1 to node Nc, and tuning current producing transistor 325 supplies a current corresponding to voltage Vf2 to node Nd.

When the data read operation is active, setting of enable signals EN6 and EN7 are interchanged, and connecting switches 85 and 95 connect the output nodes of voltage comparators 80 and 90 to nodes Nf and Ng, respectively. Thereby, the feedback path of read voltage VR is interrupted.

However, capacitors 307 and 317 hold the final voltages, which were placed on nodes Nfb and Ngb during the inactive state of the data read operation, and thus hold voltages Vf1 and Vf2 tuned by the feedback of read voltage VR.

When the data read operation is inactive, enable signal EN8 is inactivated to attain L-level, and node Na is isolated from reference current generating circuit 60. Thereby, access current Iac corresponding to the passing current of the selected memory cell flows through node Nc. In this manner, the data read operation similar to that of the first embodiment already described starts. When starting, offset tuning circuits 300 and 310 cause the currents, which correspond to voltages Vf1 and Vf2 held by capacitors 307 and 317, and flow from nodes Nc and Nd, respectively. As a result, the data read operation can be executed while automatically tuning the offset.

Figure 14:
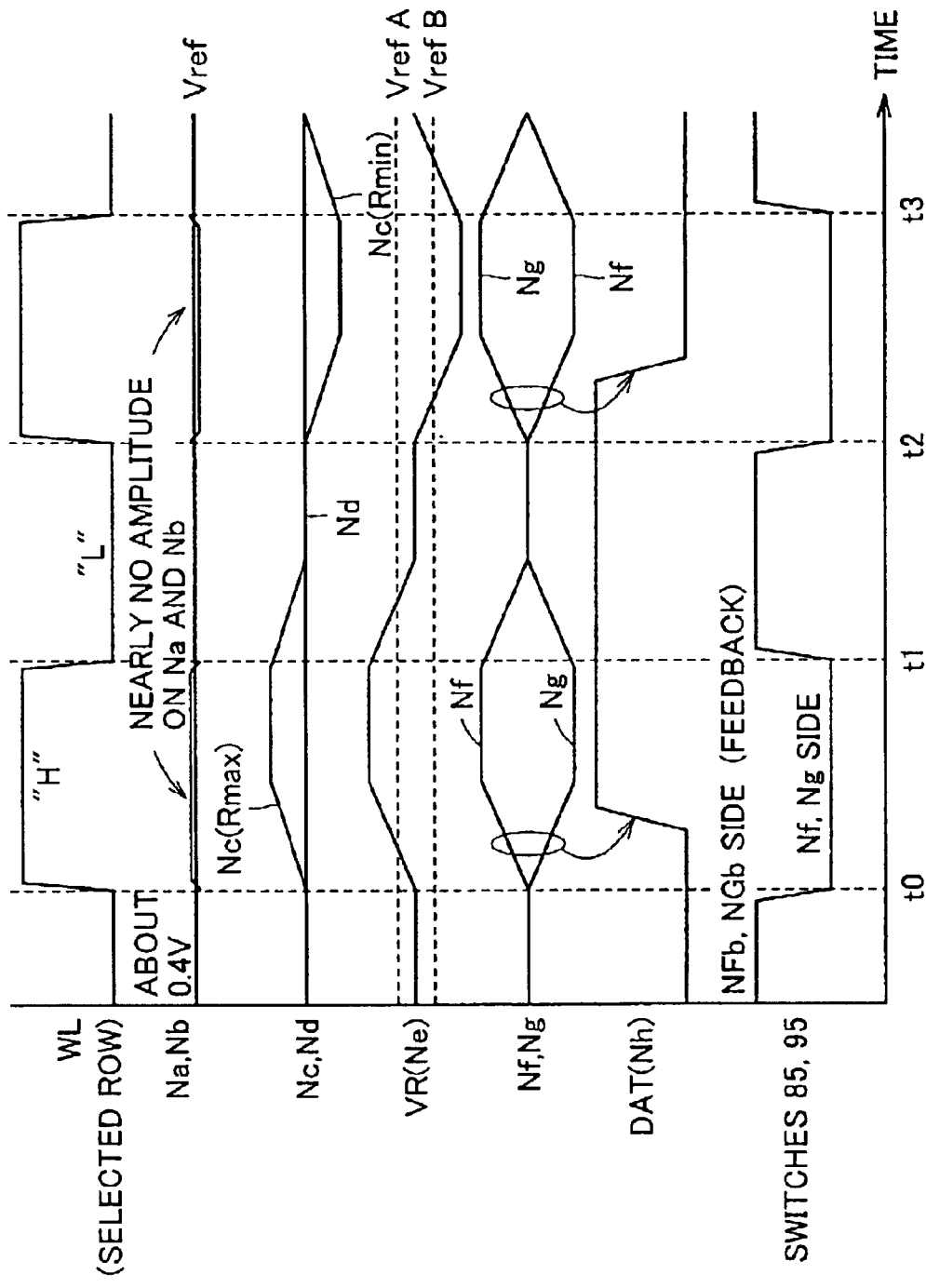
FIG. 14 is an operation waveform diagram showing the data read operation according to the third embodiment.

Before a time t0, as shown in FIG. 14, each word line WL and each dummy word line DRWL are inactive, and the data read operation is inactive. When the data read operation is inactive, connection switches 85 and 95 are set to the feedback side, and nodes Nfb and Ngb are connected to the output nodes of voltage comparators 80 and 90, respectively.

In this state, the offset of main voltage comparator 70 is automatically tuned, as already described, and results of the tuning are held in the forms of voltages Vf1 and Vf2 on nodes Nfb and Ngb by capacitors 307 and 317, respectively. Thus, during the inactive state of the data read operation, feedback control is effected on the voltage on node Nd, i.e., offset voltage Vos so that these voltages may fall within a range between reference voltages VrefA and VrefB.

The offset of main voltage comparator 70 is automatically tuned as described above, and then the data read operation similar to that shown in FIG. 4 starts at time t0. In the data read operation, connection switches 85 and 95 are controlled to connect the output nodes of voltage comparators 80 and 90 to nodes Nf and Ng, which are the input nodes of voltage comparator 98, respectively. Thereby, the data reading similar to that shown in FIG. 4 is executed.

When the data read operation temporarily ends at a time t1, the device reenters the state similar to that before time t0, and executes the automatic offset tuning on main voltage comparator 70.

When the data read operation is executed at a time t2, connection switches 85 and 95 are switched again to execute the data read operation similar to that shown in FIG. 4.

According to the structure of the third embodiment, as described above, the offset of main voltage comparator 70, i.e., the offset of current sense amplifier 50b can be automatically tuned by utilizing the period of the precharge operation and others, during which the data read operation is inactive. Thus, the data read operation can be performed in such a situation that the offset of the current sense amplifier is already tuned. Therefore, the data read operation can be performed fast and precisely.

The third embodiment has been described in connection with the structure for automatically tuning the offset in the data read current system based on the current comparison. However, a similar structure may be applied to the data read circuit system based on a voltage comparison. Thereby, in the structure shown in FIG. 12, the offset of main voltage comparator 70 for comparing voltage data can be automatically tuned in the case where the voltage data to be compared are transmitted to node Nc and Nd.

Fourth Embodiment

In the first to third embodiments of the invention, current transmitting circuits 50a and 60a are used to produce access current Iac and reference current Ir for the purpose of suppressing variations in electric resistances of MTJ memory cells and dummy memory cells having structures similar to those of the MTJ memory cells.

The fourth embodiment will now be described in connection with a structure, which can follow variations due to manufacturing of the MTJ memory cells and the dummy memory cells, and thereby can keep constant transmission characteristics of current transmitting circuits 50a and 60a.

Figure 15:
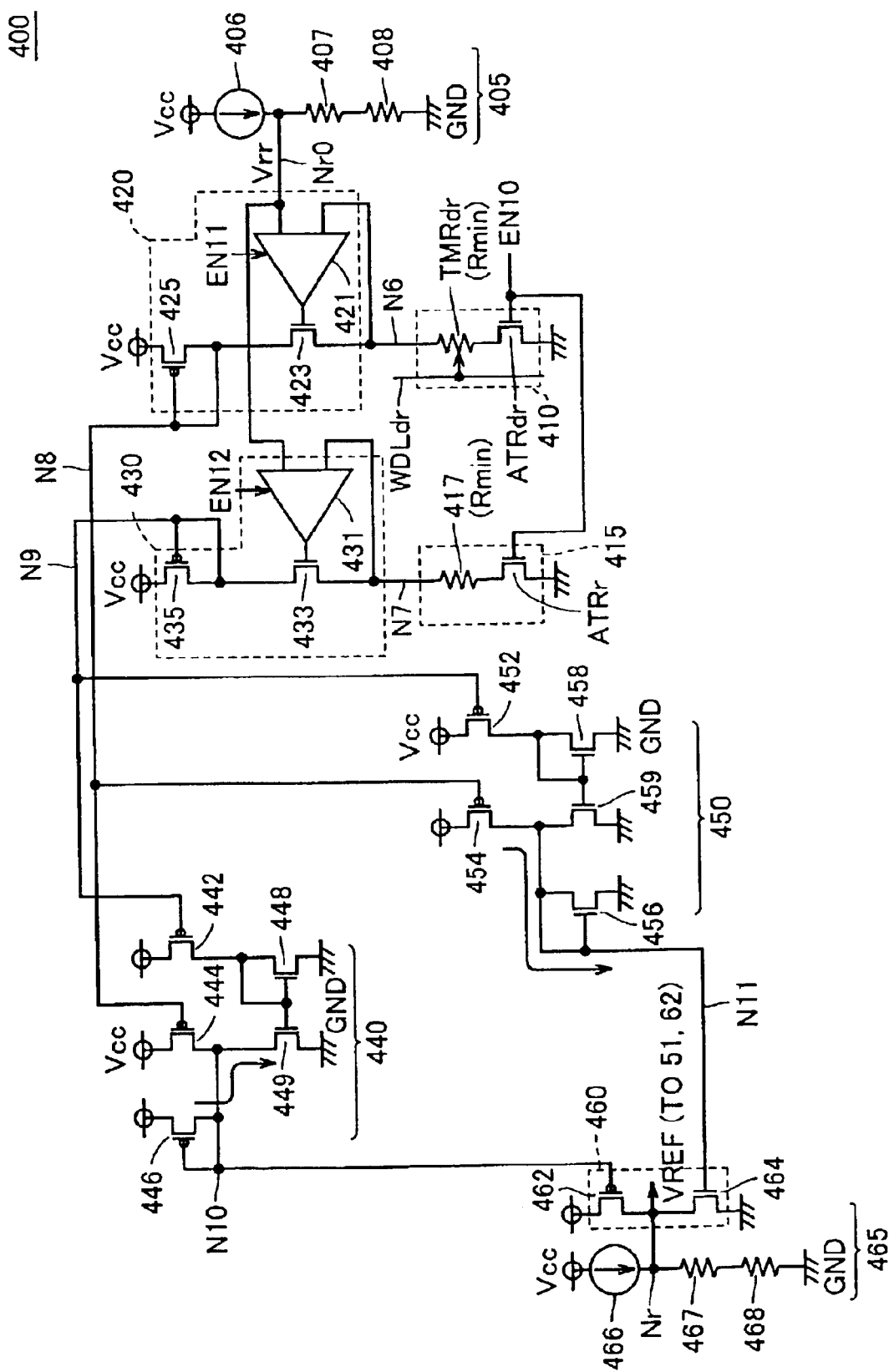
FIG. 15 is a circuit diagram showing a structure of a reference voltage generating circuit according to a fourth embodiment.

FIG. 15 is a circuit diagram showing a structure of a reference voltage generating circuit 400 according to the fourth embodiment.

Reference voltage generating circuit 400 generates reference voltage Vref to be supplied to each of voltage comparators 51 and 62 forming current transmitting circuits 50a and 60a, respectively.

Reference voltage generating circuit 400 includes a voltage generating circuit 405, a dummy memory cell 410 having a structure similar to that of the MJ memory cell, a reference cell 415 for representing a design resistance value of the MTJ memory cell, a current detecting circuit 420 provided corresponding to dummy memory cell 410, a current detecting circuit 430 provided corresponding to reference cell 415, current detecting circuits 440 and 450 for detecting a difference between the passing currents of dummy memory cell 410 and reference cell 415, a voltage generating circuit 465 having a structure similar to that of voltage generating circuit 405, and a reference voltage tuning circuit 460, which tunes the output voltage of voltage generating circuit 405 to produce reference voltage Vref in accordance with results of detection by current detecting circuits 440 and 450.

Voltage generating circuit 405 has a constant current generating circuit 406 connected between power supply voltage Vcc and a node Nr0, and resistance elements 407 and 408 connected in series between node Nr0 and ground voltage GND. Thereby, node Nr0 carries an original reference voltage Vrr.

Dummy memory cell 410 has a dummy tunneling magneto-resistance element TMRdr and an access transistor ATRdr. Dummy tunneling magneto-resistance element TMRdr is designed and manufactured similarly to tunneling magneto-resistance element TMR, and has a structure similar to that of tunneling magneto-resistance element TMR. Dummy tunneling magneto-resistance element TMRdr has stored the storage data corresponding to electric resistance Rmin.

Reference cell 415 has a fixed resistance 417 having a resistance Rmin equal to the design resistance value of tunneling magneto-resistance element TMR and an access transistor ATRr. Each of access transistors ATRr and ATRdr receives an enable signal EN10 on its gate. Therefore, in response to activation (H-level) of enable signal EN10, dummy tunneling magneto-resistance element TMRdr is electrically coupled between node N6 and ground voltage GND, and fixed resistance 417 is electrically coupled between node N7 and ground voltage GND.

As described above, the electric resistance of fixed resistance 417 is set to the same value as dummy tunneling magneto-resistance element TMRdr. Therefore, if the dummy tunneling magneto-resistance element TMRdr reflecting the electric resistance value of tunneling magneto-resistance element TMR to be accessed has been completed to satisfy substantially the design values determined in the design stag, the passing currents of fixed resistance 417 and dummy tunneling magneto-resistance element TMRdr attain the same level. In this case, the level of reference voltage Vref is set to the level of original reference voltage Vrr of the original design value (e.g., about 0.4V).

In contrast to this, if completed dummy tunneling magneto-resistance element TMRdr has an actual electric resistance different from the design value determined in the design stage, a difference occurs between the passing currents of fixed resistance 417 and dummy tunneling magneto-resistance element TMRdr. Current detecting circuits 420 and 430 transmit the difference between these passing currents to the current difference between nodes N8 and N9.

Current detecting circuit 420 has a voltage comparator 421 for making a comparison between the voltage on node N6 and original reference voltage Vrr, an N-channel MOS transistor 423 electrically coupled between nodes N6 and N8, and a P-channel MOS transistor 425 electrically coupled between power supply voltage Vcc and node N8. The output of voltage comparator 421 is applied to the gate of transistor 423. Voltage comparator 421 operates in response to an enable signal EN11.

Likewise, current detecting circuit 430 has a voltage comparator 431 for making a comparison between the voltage on node N7 and original reference voltage Vrr, an N-channel MOS transistor 433 electrically coupled between nodes N7 and N9, and a P-channel MOS transistor 435 electrically coupled between power supply voltage Vcc and node N9. The output of voltage comparator 431 is applied to the gate of transistor 433. Voltage comparator 431 operates in response to an enable signal EN12.

Thereby, the current transmitting circuit formed of voltage comparator 421 and transmitting transistor 423 transmits the passing current of dummy memory cell 410 to node N8. Likewise, the current transmitting circuit formed of voltage comparator 431 and transmitting transistor 433 transmits the passing current of reference cell 415 to node N9.

Current detecting circuit 440 includes a P-channel MOS transistor 442 and an N-channel MOS transistor 448 connected in series between power supply voltage Vcc and ground voltage GND, P-channel MOS transistors 444 and 446 connected in parallel between power supply voltage Vcc and node N10, and an N-channel MOS transistor 449 connected between node N10 and ground voltage GND. The connection node between transistors 442 and 448 is connected to each of the gates of transistors 448 and 449. The gate of transistor 446 is connected to node N10. The gate of transistor 442 is connected to node N9, and the gate of transistor 444 is connected to node N8.

Current detecting circuit 450 includes a P-channel MOS transistor 452 and an N-channel MOS transistor 458 connected in series between power supply voltage Vcc and ground voltage GND, a P-channel MOS transistor 454 connected between power supply voltage Vcc and node N11, and N-channel MOS transistors 456 and 459 connected in parallel between node N11 and ground voltage GND. The connection node between transistors 452 and 458 is connected to each of the gates of transistors 458 and 459. The gate of transistor 456 is connected to node N11. The gate of transistor 452 is connected to node N9, and the gate of transistor 454 is connected to node N8.

When the passing current of node N8 is smaller than the passing current of node N9, and thus when the electric resistance of dummy tunneling magneto-resistance element TMRdr is larger than the resistance value of fixed resistance 417, current detecting circuit 440 passes a current through a path including transistors 446 and 449, as indicated by an arrow in FIG. 15, and thereby lowers the voltage on node N10.

Conversely, when the passing current of node N8 is larger than the passing current of node N9, and thus when the electric resistance of dummy tunneling magneto-resistance element TMRdr is smaller the design value Rmin, current detecting circuit 450 passes a current through a path including transistor 454, as indicated by an arrow in FIG. 15, and thereby raises the voltage on node N11.

Voltage generating circuit 465 is designed similarly to voltage generating circuit 405, and has a constant current generating circuit 466 and resistance elements 467 and 468. Thus, the current supply amount of constant current generating circuit 466 is designed similarly to constant current generating circuit 406 in voltage generating circuit 405. Likewise, the resistance values of resistance elements 467 and 468 are designed similarly to those of resistance elements 407 and 408 in voltage generating circuit 405. Thereby, voltage generating circuit 465 operates to produce original reference voltage Vrr, which is similar to that on node Nr0, on a node Nr2.

Reference voltage tuning circuit 460 has a P-channel MOS transistor 462, which is electrically coupled between node Nr carrying reference voltage Vref and power supply voltage Vcc, and an N-channel MOS transistor 464 electrically coupled between node Nr and ground voltage GND. The gate of transistor 462 is connected to node N10, and the gate of transistor 464 is connected to node N11.

According to this structure, when the electric resistance of dummy memory cell 410 is larger than the electric resistance of reference cell 415, current detecting circuit 440 lowers the gate voltage of transistor 462, and reference voltage Vref rises. When the electric resistance of dummy memory cell 410 is lower than the electric resistance of reference cell 415, current detecting circuit 440 raises gate voltage of transistor 462, and reference voltage Vref lowers.

Therefore, when the resistance value of the dummy memory cell is larger or smaller than the design value, the level of reference voltage Vref is automatically changed from the initial design value (original reference voltage Vrr) in accordance with the difference between them. In other words, reference voltage generating circuit 400 tunes the level of reference voltage Vref in accordance with the results of manufacturing of the MTJ memory cell.

Thereby, the level of reference voltage Vref can be tuned by following the manufacturing variations of the dummy memory cell, and thus the manufacturing variations of the MTJ memory cell so that constant transmission characteristics can be maintained in current transmitting circuit 50a for producing access current Iac and current transmitting circuit 60a in reference current generating circuit 60.

Thereby, access current Iac and reference current Ir can be produced at similar response speeds by following the manufacturing variations in electric resistance after the data writing of the MTJ memory cell. Thereby, the data read speed is held constant, and a read operation margin can be ensured.

Enable signals EN10–EN12 are inactivated to attain L-level in a sleep mode or the like requiring operations with low power consumption. Thereby, a through current in reference voltage generating circuit 400 is suppressed, and the power consumption can be reduced.

The above embodiment has been described in connection with a typical structure provided with the MTJ memory cells, which are magnetized in the direction corresponding to the storage data, and have the electric resistances varying in accordance with the direction of the magnetization. However, the invention can be generally applied to structures other than the above. The invention can be applied to semiconductor memory devices provided with memory cells, of which passing current changes in accordance with the storage data during an access operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a plurality of memory cells each having passing current changing in accordance with storage data during access;
    an access current transmitting circuit for passing, to a first node, an access current corresponding to said passing current of a selected memory cell selected from said plurality of memory cells as an access target;
    a reference current generating circuit for passing a reference current to a second node during data reading;
    a current comparing circuit for producing a read voltage corresponding to a difference between currents flowing through said first and second nodes, respectively; and
    a test current supply circuit for supplying an externally test current to at least one of said first and second nodes in a test mode.

2. The semiconductor memory device according to claim 1, further comprising
    an offset detecting circuit for evaluating offset occurring in said current comparing circuit based on said read voltage in said test mode, wherein said test current supply circuit supplies said test currents to each of said first and second nodes in said test mode.

3. The semiconductor memory device according to claim 2, wherein said offset detecting circuit detects in said test mode whether said read voltage falls within a predetermined range or not.

4. The semiconductor memory device according to claim 2, wherein
    each of said memory cells is designed to have one of a first electric resistance and a second electric resistance larger than said first electric resistance in accordance with the level of said storage data, and
    said access current transmitting circuit includes a transmission switch portion for electrically coupling said first node to a third node connected to said selected memory cell and passing said passing current based on a comparison made between the voltage on said third node and a reference voltage.

5. The semiconductor memory device according to claim 2, wherein
said current comparing circuit includes:
a first impedance tuning circuit for tuning an input impedance to said first node in accordance with a first control signal, and
a second impedance tuning circuit for tuning an input impedance to a second node in accordance with a second control signal different from said first control signal.

6. The semiconductor memory device according to claim 5, further comprising:
a decode circuit for producing said first and second control signals in accordance with an externally applied test input in said test mode:
a memory portion for storing said first and second control signals to be used in a normal operation; and
a selector circuit for selectively transmitting said first and second control signals from one of said decode circuit and said memory portion to said current comparing circuit, wherein
said first and second control signals stored in said memory portion are set corresponding to said test input applied when said offset of said current comparing circuit is smaller than a predetermined level in said test mode.

7. The semiconductor memory device according to claim 1, further comprising
a current detecting circuit for detecting a relationship in magnitude of one of said access current and said reference current with said test current based on said read voltage in said test mode, wherein
said test current supply circuit supplies said test currents to one of said first and second nodes, instead of one of said access current and said reference current, in said test mode.

8. The semiconductor memory device according to claim 7, wherein
said reference current generating circuit includes:
a dummy memory cell for passing therethrough a current intermediate between two kinds of the passing currents corresponding to two kinds of levels of said storage data in each of said memory cells, respectively,
a current transmitting circuit for transmitting the current passing through said dummy memory cell to a third node, and
a current generating circuit for generating said reference current in accordance with a current flowing through said third node; and
said current transmitting circuit has an input impedance tuned in accordance with a control signal.

9. A semiconductor memory device comprising:
a plurality of memory cells each for holding storage data;
a first node, in a read operation, being electrically connected to a selected memory cell selected from said plurality of memory cells as an access target;
a second node for transmitting a electric reference signal in order to be compared with a electric signal transmitted by said first node, in said read operation;
a data read circuit for outputting a read voltage according to a difference between the electric signals of said first and second nodes in said data read operation; and
a first offset tuning circuit for tuning input impedance of said first and second nodes in accordance with first and second control voltages obtained by feedback of said read voltage so as to keep said read voltage within a predetermined range when said data read operation is inactive.

10. The semiconductor memory device according to claim 9, wherein
said data read circuit outputs said read voltage corresponding to a voltage difference between said first and second nodes in said data read operation, and said semiconductor memory device further comprises:
a voltage holding circuit for holding said first and second control voltages; and
a switch circuit for interrupting a feedback path of said read voltage in said data read operation.

11. The semiconductor memory device according to claim 10, further comprising:
a second offset tuning circuit for applying equal voltages to said first and second nodes, respectively, during a period other than said data read operation.

12. The semiconductor memory device according to claim 9, wherein
each of said plurality of memory cells has passing current changing in accordance with said storage data during access; and
said semiconductor memory device further comprises:
an access current transmitting circuit for passing, to said first node, an access current corresponding to said passing current of said selected memory cell;
a reference current generating circuit for passing a reference current to said second node as said electric reference signal in said data read operation; and
a current switching circuit for carrying said reference current instead of said access current to said first node when said data read operation is inactive; wherein
said data read circuit outputs said read voltage according to a difference between currents flowing through said first and second nodes, respectively.

13. The semiconductor memory device according to claim 12, further comprising:
a voltage holding circuit for holding said first and second control voltages, and
a switch circuit for interrupting a feedback path of said read voltage in said data read operation.

14. The semiconductor memory device according to claim 12, wherein
said first offset tuning circuit includes:
a first tuning current generating circuit for carrying a current corresponding to said first control voltage into or from said first node, and
a second tuning current generating circuit for carrying a current corresponding to said second control voltage into or from said second node.

15. A semiconductor memory device comprising:
a plurality of memory cells each having passing current changing in accordance with storage data during access;
an access current transmitting circuit for passing an access current depending on said passing current to a first node, based on a comparison between a reference voltage and a voltage on an internal node passing said passing current therethrough and connected to the selected memory cell selected as an access target from said plurality of memory cells;
a reference current generating circuit for passing a reference current to a second node during data reading;
a current comparing circuit for producing a read voltage corresponding to a difference between the currents flowing through said first and second nodes, respectively; and
a reference current tuning circuit for tuning a level of said reference voltage in accordance with a result of manufacturing of each of said memory cells.

16. The semiconductor memory device according to claim 15, wherein
said reference current tuning circuit includes:
a dummy memory cell formed on said semiconductor memory device, and having a structure similar to that of each of said memory cells, and
a voltage tuning circuit for tuning a level of said reference voltage in accordance with a passing current of said dummy memory cell.

17. A semiconductor memory device comprising:
a plurality of memory cells each having passing current changing in accordance with storage data during access;
an access current transmitting circuit for passing, to a first node, an access current corresponding to said passing current of the selected memory cell selected from said plurality of memory cells as an access target; and
a reference current generating circuit for passing a reference current to a second node during data reading,
said reference current generating circuit including:
a plurality of dummy memory cells formed on said semiconductor memory device, and each having a structure similar to that of said memory cell, and
a current generating circuit for generating said reference current based on the passing currents of said plurality of dummy memory cells; wherein
at least one of said plurality of dummy memory cells store one of two kinds of levels of said storage data, and at least another one of said memory cells store the other of said two kinds of levels of said storage data; and
said semiconductor memory device further comprising
a current comparing circuit for producing a read voltage corresponding to a difference between currents flowing through said first and second nodes, respectively.

18. The semiconductor memory device according to claim 17, wherein
said current generating circuit generates said reference current in accordance with an average value of the passing currents of the dummy memory cells storing said one of said two kinds of levels and the passing currents of the dummy cells storing said the other of said two kinds of levels.

19. A semiconductor memory device comprising:
a plurality of memory cells, each having passing current changing in accordance with storage data during access;
a reference current generating circuit generating a reference current; and
a test circuit for checking a level of said reference current in a test mode, wherein
said reference current is compared with an access current corresponding to said passing current of a selected memory cell selected from said plurality of memory cells as an access target in a normal data read.

20. The semiconductor memory device according to claim 19, wherein
said reference current generating circuit includes a plurality of dummy memory cells, each having a structure similar to a structure of each of said plurality of memory cells, and generates said reference current based on passing currents of said plurality of memory cells.

21. The semiconductor memory device according to claim 19, wherein
said test circuit includes a test current supply circuit supplying a test current being preset at a prescribed level in said test mode, and in said test mode, said reference current is compared with said test current.

22. The semiconductor memory device according to claim 21, wherein
said prescribed level of said test current is adjustable.

23. A semiconductor memory device comprising:
a plurality of memory cells each having passing current changing in accordance with storage data during access;
a first node being configured to be passed an access current therethrough, said access current being according to said storage data of a selected memory cell selected from said plurality of memory cells as an access target;
a second node;
a reference current generating circuit for passing a reference current to said second node during data reading;
a current comparing circuit for producing a read voltage corresponding to a difference between currents flowing through said first and second nodes, respectively;
a first decode circuit for producing first control signals to adjust a characteristic of said current comparing circuit in accordance with an test input;
a second decode circuit for producing second signals to adjust a magnitude of said reference current in accordance with an test input;
a first memory portion for storing said first control signals to be used in a normal operation;
a second memory portion for storing said second control signals to be used in said normal operation;
a first selector circuit for selectively transmitting said first control signals from one of said first decode circuit and said first memory portion to said current comparing circuit; and
a second selector circuit for selectively transmitting said second control signals from one of said second decode circuit and said second memory portion to said reference current generating circuit.

24. The semiconductor memory device according to claim 23, wherein
said current comparing circuit includes:
a first impedance tuning circuit for tuning an input impedance to said first node in accordance with a part of said first control signals, and
a second impedance tuning circuit for tuning an input impedance to said second node in accordance with another part of said first control signals.

25. The semiconductor memory device according to claim 23, wherein
said reference current generating circuit includes:
a dummy memory cell for passing therethrough a current intermediate between two kinds of the passing currents corresponding to two kinds of levels of said storage data in each of said memory cells, respectively,
a current transmitting circuit for transmitting the current passing through said dummy memory cell to a third node, and
a current generating circuit for generating said reference current in accordance with a current flowing through said third node; and
said current transmitting circuit has an input impedance adjusted in accordance with said second control signals.

* * * * *